US012771301B2

(12) United States Patent
Wang et al.

(10) Patent No.: US 12,771,301 B2
(45) Date of Patent: Oct. 20, 2026

(54) BIAS VOLTAGE GENERATING CIRCUIT, SIGNAL GENERATOR CIRCUIT AND POWER AMPLIFIER

(71) Applicant: TRON FUTURE TECH INC., Hsinchu City (TW)

(72) Inventors: Yu-Jiu Wang, Hsinchu City (TW); Hao-Chung Chou, Hsinchu City (TW); Yue Ming Wu, Hsinchu City (TW); Ta-Shun Chu, Hsinchu City (TW)

(73) Assignee: TRON FUTURE TECH INC., Hsinchu City (TW)

( * ) Notice: Subject to any disclaimer, the term of this patent is extended or adjusted under 35 U.S.C. 154(b) by 442 days.

(21) Appl. No.: 18/421,997

(22) Filed: Jan. 25, 2024

(65) Prior Publication Data

US 2024/0291441 A1 Aug. 29, 2024

Related U.S. Application Data

(60) Provisional application No. 63/486,845, filed on Feb. 24, 2023.

(51) Int. Cl.
*H03F 1/34* (2006.01)
*H03F 1/30* (2006.01)
*H03F 3/21* (2006.01)

(52) U.S. Cl.
CPC ............... *H03F 1/342* (2013.01); *H03F 1/30* (2013.01); *H03F 3/21* (2013.01); *H03F 2200/451* (2013.01)

(58) Field of Classification Search
CPC ... H03F 1/342; H03F 1/30; H03F 3/21; H03F 2200/447; H03F 2200/451; H03F 3/195;
(Continued)

(56) References Cited

U.S. PATENT DOCUMENTS 5,959,492 A * 9/1999 Khoury ............... H03F 3/45479 327/333
6,262,628 B1 * 7/2001 Shinomiya .......... H03F 3/45991 330/252

(Continued)

OTHER PUBLICATIONS

Office Action issued by TIPO dated Jan. 10, 2025 for TW113102904.

(Continued)

*Primary Examiner* — John W Poos
(74) *Attorney, Agent, or Firm* — WPAT, P.C.; Anthony King

(57) ABSTRACT

A bias voltage generating circuit includes an amplifier circuit and a negative feedback circuit. The amplifier circuit is configured to generate a bias voltage according to a first voltage input and a second voltage input. The negative feedback circuit is coupled to the amplifier circuit, and configured to control the first voltage input. The negative feedback circuit includes a first voltage generator and a second voltage generator. The first voltage generator, coupled to the amplifier circuit, is biased by the bias voltage and configured to amplify a third voltage input to generate the first voltage input. The second voltage generator, coupled to the first voltage generator, is configured to generate the third voltage input. A ratio of the first voltage input to the third voltage input is locked according to a ratio of the second voltage input to the third voltage input.

20 Claims, 16 Drawing Sheets

(58) Field of Classification Search

CPC .. H03F 3/245; H03F 3/45632; H03F 3/45928; H03F 3/68; H03F 3/45188; H03F 3/45475; H03F 3/45179; H03F 3/19; H03F 3/45183; H03F 2200/411; H03F 3/211; H03F 3/193; H03F 2200/102; H03F 1/0261; H03F 1/301; H03F 2200/18; H03F 2203/45528; H03F 3/72; H03F 1/0227; H03F 2203/45594; H03F 2200/129; H03F 2203/45138; H03F 1/56; H03F 2203/45116; H03F 3/217; H03F 1/223; H03F 1/3211; H03F 1/34; H03F 1/083; H03F 2200/294; H03F 1/086; H03F 1/0205; H03F 3/45192; H03F 1/0216; H03F 3/24; H03F 1/22; H03F 2203/21131; H03F 3/45; H03F 1/0211; H03F 2200/336; H03F 3/45071; H03F 3/45197; H03F 1/26; H03F 1/305; H03F 2200/78; H03F 2203/21139; H03F 2203/7215; H03F 3/347; H03F 1/0266; H03F 1/302; H03F 3/2171; H03F 2200/105; H03F 2200/165; H03F 2200/261; H03F 2203/45151; H03F 2203/45398; H03F 2203/45536; H03F 3/3022; H03F 3/45237; H03F 3/45273; H03F 2200/468; H03F 3/505; H03F 2200/267; H03F 2200/408; H03F 2200/453; H03F 2203/45418; H03F 2203/45544; H03F 3/082; H03F 1/02; H03F 2200/555; H03F 2203/45026; H03F 2203/45136; H03F 2203/45424; H03F 2203/45481; H03F 2203/45511; H03F 2203/45512; H03F 2203/45526; H03F 2203/45674; H03F 3/04; H03F 3/08; H03F 3/183; H03F 3/45748; H03F 1/42; H03F 2200/168; H03F 2200/27; H03F 2200/306; H03F 2203/45288; H03F 2203/45494; H03F 2203/45508; H03F 2203/45701; H03F 3/087; H03F 3/191; H03F 3/2173; H03F 2200/375; H03F 2200/456; H03F 2200/462; H03F 2200/541; H03F 2203/45246; H03F 2203/45342; H03F 2203/45466; H03F 2203/45514; H03F 3/301; H03F 3/4508; H03F 3/45085; H03F 3/45659; H03F 3/45744; H03F 1/0233; H03F 1/0238; H03F 1/025; H03F 1/0272; H03F 1/3205; H03F 2200/03; H03F 2200/111; H03F 2200/228; H03F 2200/351; H03F 2200/366; H03F 2200/504; H03F 2200/513; H03F 2203/21106; H03F 2203/45112; H03F 2203/45372; H03F 2203/45692; H03F 2203/45718; H03F 2203/45726; H03F 2203/7206; H03F 2203/7209; H03F 2203/7236; H03F 3/181; H03F 3/213; H03F 3/3028; H03F 3/345; H03F 3/45201; H03F 3/45242; H03F 1/0244; H03F 1/0277; H03F 1/32; H03F 1/3217; H03F 2200/151; H03F 2200/171; H03F 2200/372; H03F 2200/405; H03F 2200/511; H03F 2203/30031; H03F 2203/45024; H03F 2203/45066; H03F 2203/45101; H03F 2203/45114; H03F 2203/45156; H03F 2203/45286; H03F 2203/45336; H03F 2203/45394; H03F 2203/45588; H03F 2203/45622; H03F 2203/45631; H03F 3/187; H03F 3/189; H03F 3/265; H03F 3/45937; H03F 3/45959; H03F 3/45991; H03F 3/605; H03G 3/30; H03G 3/3042; H03G 1/0088; H03G 1/0029; H03G 1/0023; H03G 3/3036; H03G 3/3047; H03G 3/3084; H03G 2201/103; H03G 3/007; H03G 3/12; H03G 1/0005; H03G 1/007; H03G 1/0082; H03G 2201/708; H03G 3/001; H03G 3/3005; H03G 3/3068; H03G 3/348; H03G 7/001; H03G 11/02; H03G 2201/204; H03G 2201/305; H03G 2201/307; H03G 2201/506; H03K 3/011; H03K 17/145; H03K 19/00315; H03K 3/0231; H03K 19/018521; H03K 19/0027; H03K 19/00384; H03K 3/354; H03K 17/6872; H03K 19/018585; H03K 19/017509; H03K 19/018507; H03K 5/08; H03K 5/2481; H03K 17/063; H03K 17/687; H03K 2217/0018; H03K 3/0315; H03K 17/0822; H03K 17/102; H03K 17/22; H03K 19/0013; H03K 19/00361; H03K 17/162; H03K 17/165; H03K 17/693; H03K 5/1252; H03K 5/133; H03K 3/012; H03K 4/501; H03K 19/0175; H03K 19/018514; H03K 2217/0027; H03K 2217/0081; H03K 3/0322; H03K 5/24; H03K 7/08; H03K 19/00; H03K 19/017545; H03K 19/018557; H03K 3/027; H03K 5/249; H03K 17/0406; H03K 17/042; H03K 17/0828; H03K 17/168; H03K 17/302; H03K 19/00346; H03K 2217/0063; H03K 23/667; H03K 3/0377; H03K 4/48; H03K 5/12; H03K 5/13; H03K 17/18; H03K 17/223; H03K 17/60; H03K 17/6221; H03K 17/6871; H03K 17/90; H03K 19/0008; H03K 19/00369; H03K 19/01707; H03K 19/20; H03K 2005/00156; H03K 21/00; H03K 23/662; H03K 3/02; H03K 3/353; H03K 3/356104; H03K 19/0016; H03K 19/0185; H03K 19/096; H03K 2005/00026; H03K 2217/0072; H03K 3/02335; H03K 3/02337; H03K 3/03; H03K 3/28; H03K 3/3565; H03K 4/023; H03K 5/086; H03K 5/1565; H03K 17/0826; H03K 17/122; H03K 17/14; H03K 17/16; H03K 17/567; H03K 17/955; H03K 19/0005; H03K 19/0019; H03K 19/003; H03K 19/017581; H03K 19/094; H03K 19/1731; H03K 19/177; H03K 19/17728; H03K 2005/00058; H03K 2005/00163; H03K 2217/960725; H03K 3/2893; H03K 3/356017; H03K 3/356043; H03K 3/356069; H03K 5/00006; H03K 5/01; H03K 5/023; H03K 5/14; H03K 5/22; H03K 5/2445; H03K 5/2472; H03K 17/08; H03K 17/08126; H03K 17/166; H03K 17/28; H03K 17/284; H03K 17/296; H03K 17/603; H03K 17/6877; H03K 17/9517; H03K 19/013; H03K 19/01812; H03K 19/018528; H03K 19/018571; H03K

19/086; H03K 19/17768; H03K 2005/00052; H03K 2005/00097; H03K 2005/00123; H03K 2005/0013; H03K 2005/00143; H03K 2005/00202; H03K 2005/00286; H03K 2017/515; H03K 23/68; H03K 3/023; H03K 3/0233; H03K 3/037; H03K 3/315; H03K 3/35613; H03K 3/57; H03K 3/84; H03K 4/04; H03K 4/502; H03K 4/56; H03K 4/696; H03K 4/72; H03K 4/90; H03K 5/02; H03K 5/134; H03K 5/135; H03K 5/145; H03K 7/02; H03K 7/06

See application file for complete search history.

(56) References Cited

U.S. PATENT DOCUMENTS

| | | | | |
|---|---|---|---|---|
| 6,476,649 | B1 * | 11/2002 | Goren | H03K 17/14 327/563 |
| 7,471,107 | B1 * | 12/2008 | Fortin | H03K 17/145 326/87 |
| 2007/0200623 | A1 * | 8/2007 | Suzuki | H03F 3/45183 330/127 |
| 2017/0269619 | A1 * | 9/2017 | Ciomaga | G05F 1/575 |

OTHER PUBLICATIONS

English Summary of the Office Action issued by TIPO dated Jan. 10, 2025 for TW113102904.

English translation of the Search Report appended to the Office Action issued by TIPO dated Jan. 10, 2025 for TW113102904.

* cited by examiner

BIAS VOLTAGE GENERATING CIRCUIT, SIGNAL GENERATOR CIRCUIT AND POWER AMPLIFIER

PRIORITY CLAIM AND CROSS-REFERENCE

The present application claims priority to U.S. Provisional Patent Applications including Ser. No. 63/486,845, filed on Feb. 24, 2023, which is incorporated by reference herein in its entirety.

BACKGROUND

The present disclosure relates to bias voltage generation and, more particularly, to a bias voltage generating circuit capable of controlling a transconductance of a main circuit, a signal generator circuit and a power amplifier with immunity to process, voltage and temperature (PVT) variations.

Electrical characteristics of a chip may be sensitive to manufacturing variations and environmental variations. For example, a voltage gain or an amplifier gain of the chip can be affected by PVT variations, resulting in system instability. To improve the system performance, some calibration techniques may be applied to the chip. However, in multi-chip system applications (e.g. phased array beamforming), different chips can present different characteristics from each other, which increases the cost of system calibration. Thus, there is a need in the art for an improved design to reduce the adverse effects resulting from the PVT variations.

SUMMARY

The described embodiments provide a bias voltage generating circuit capable of controlling a transconductance of a main circuit, a signal generator circuit and a power amplifier with immunity to process, voltage and temperature (PVT) variations.

Some embodiments described herein may include a bias voltage generating circuit. The bias voltage generating circuit includes an amplifier circuit and a negative feedback circuit. The amplifier circuit is configured to generate a bias voltage according to a first voltage input and a second voltage input. The negative feedback circuit is coupled to the amplifier circuit, and configured to control the first voltage input. The negative feedback circuit includes a first voltage generator and a second voltage generator. The first voltage generator, coupled to the amplifier circuit, is biased by the bias voltage and configured to amplify a third voltage input to generate the first voltage input. The second voltage generator, coupled to the first voltage generator, is configured to generate the third voltage input. A ratio of the first voltage input to the third voltage input is locked according to a ratio of the second voltage input to the third voltage input.

Some embodiments described herein may include a signal generator circuit. The signal generator circuit includes a main circuit and a bias voltage generating circuit. The main circuit is biased by a bias voltage, and configured to amplify an input signal to generate an output signal. The bias voltage generating circuit is coupled to the main circuit. The bias voltage generating circuit includes an amplifier circuit, a first voltage generator and a second voltage generator. The amplifier circuit is configured to generate the bias voltage according to a first voltage input and a second voltage input. The first voltage generator, coupled to the amplifier circuit, is biased by the bias voltage and configured to amplify a third voltage input to generate the first voltage input. Direct current (DC) biasing of the main circuit is the same as DC biasing of the first voltage generator. The second voltage generator, coupled to the first voltage generator, is configured to generate the third voltage input. A ratio of the first voltage input to the third voltage input is locked according to a ratio of the second voltage input to the third voltage input.

Some embodiments described herein may include a power amplifier. The power amplifier includes a power stage and a preamplifier. The power stage is driven by a drive signal to generate an output signal. The preamplifier, coupled to the power stage, is configured to provide an alternating current (AC) component of the drive signal. The preamplifier includes a main circuit, a first amplifier circuit, a first voltage generator and a second voltage generator. The main circuit, biased by a bias voltage, is configured to amplify an input signal to generate the AC component of the drive signal. The first amplifier circuit is configured to generate the bias voltage according to a first voltage input and a second voltage input. The first voltage generator, coupled to the first amplifier circuit, is biased by the bias voltage and configured to amplify a third voltage input to generate the first voltage input. The second voltage generator, coupled to the first voltage generator, is configured to generate the third voltage input. A ratio of the first voltage input to the third voltage input is locked according to a ratio of the second voltage input to the third voltage input. The power amplifier further includes a third voltage generator. The third voltage generator, coupled to the power stage, is configured to provide a direct current (DC) component of the drive signal.

With the use of the proposed bias scheme, a bias circuit can keep a small-signal gain of a main circuit (biased by the bias circuit) constant/stable against PVT variations. In addition, the proposed bias scheme can be applied to large signal operation to thereby keep output power of a power amplifier constant/stable against PVT variations. The proposed bias scheme can reduce the influence of PVT variations on a chip gain, decrease the cost of measurement and calibration for a single chip, and effectively reduce the gain variations across mass-produced chips to thereby decrease system calibration cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
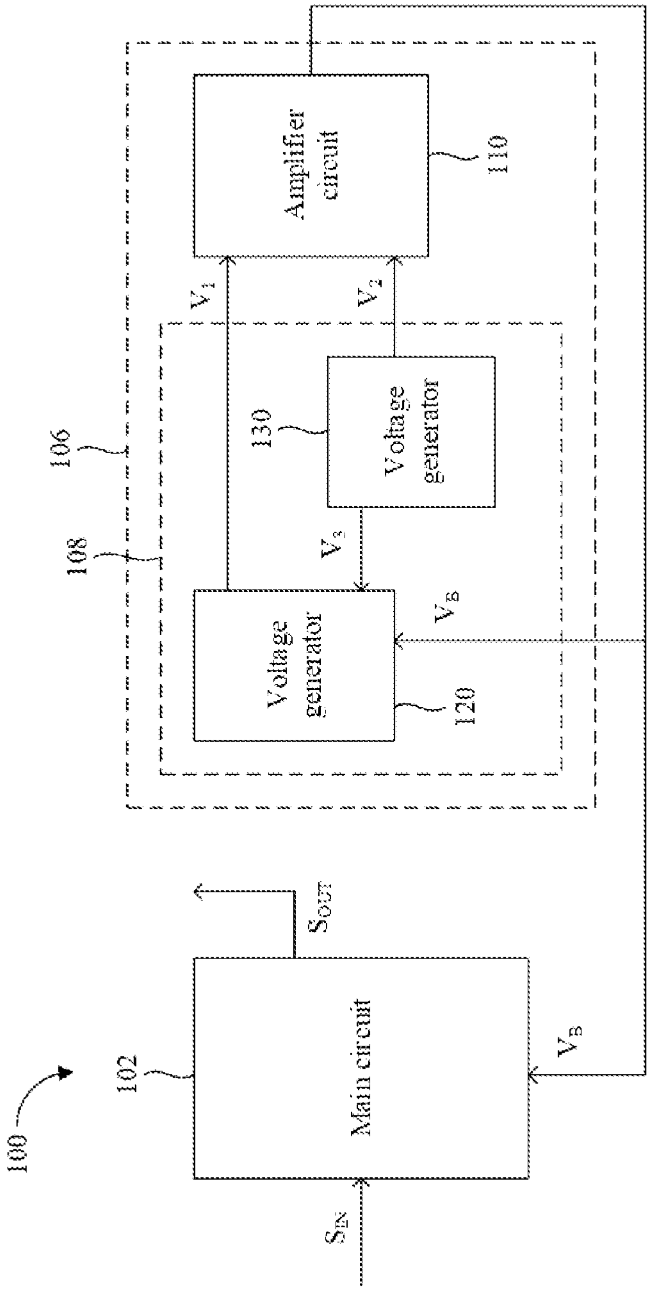
FIG. 1 is a diagram illustrating an exemplary signal generator circuit in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it may be directly connected to or coupled to the other element, or intervening elements may be present.

The present disclosure describes exemplary bias voltage generating circuits, each of which can provide a bias voltage to a main circuit and accordingly lock/control a gain of the main circuit. The exemplary bias voltage generating circuit can keep a gain of the main circuit stable against PVT variations, thereby improving system stability and reducing system calibration cost. For example, the exemplary bias voltage generating circuit can utilize a negative feedback loop to lock a gain of an amplifier, which has the same direct current (DC) bias point as that of the main circuit. The exemplary bias voltage generating circuit can lock/control a transconductance of the main circuit by locking/controlling a transconductance of the amplifier. In some embodiments, at least a portion of the main circuit may be implemented using a small-signal amplifier, such as a low-frequency amplifier, a tuned amplifier or a low-noise amplifier.

The proposed bias scheme can be applied to small signal operation and large signal operation. For example, the present disclosure further describes exemplary signal generator circuits and power amplifiers. The exemplary signal generator circuit can utilize the proposed bias scheme to keep a small-signal gain thereof constant/stable against PVT variations. The exemplary power amplifier can utilize the proposed bias scheme to keep output power thereof constant/stable against PVT variations. Further description is provided below.

FIG. 1 is a diagram illustrating an exemplary signal generator circuit in accordance with some embodiments of the present disclosure. The signal generator circuit 100 can be arranged to generate an output signal Sour according to an input signal $S_{IN}$. The signal gain, i.e. a ratio of the output signal Sour to the input signal $S_{IN}$, can be controllable or kept constant. In some examples, the signal gain can be expressed in terms of a constant or controllable transconductance.

The signal generator circuit 100 can include a main circuit 102 and a bias voltage generating circuit 106. The main circuit 102 is biased by a bias voltage $V_B$, and configured to generate the output signal $S_{OUT}$ by amplifying the input signal $S_{IN}$. The main circuit 102 can be used for small-signal amplification. By way of example but not limitation, the main circuit 102 can be implemented using a small-signal amplifier, such as a low-frequency small-signal amplifier, a small-signal tuned amplifier or a small-signal low-noise amplifier.

The bias voltage generating circuit 106 (also referred to as a bias circuit) is coupled to the main circuit 102, and configured to provide the bias voltage $V_B$ to the main circuit 102. The bias voltage generating circuit 106 includes, but is not limited to, an amplifier circuit 110, a voltage generator 120 and a voltage generator 130. The amplifier circuit 110 can be configured to generate the bias voltage $V_B$ according to a voltage input $V_1$ and a voltage input $V_2$. For example, the amplifier circuit 110 is configured to amplify a difference between the voltage inputs $V_1$ and $V_2$ to generate the bias voltage $V_B$.

The voltage generator 120 is coupled to the amplifier circuit 110 and biased by the bias voltage $V_B$. The voltage generator 120 is configured to amplify a voltage input $V_3$ to generate the voltage input $V_1$. In other words, the voltage generator 120 and the main circuit 102 can perform signal amplification under the same bias voltage $V_B$.

The voltage generator 130, coupled to the voltage generator 120, can be configured to generate the voltage input $V_3$. A voltage gain of the voltage generator 120 (i.e. a ratio of the voltage input $V_1$ to the voltage input $V_3$) can be locked according to a ratio of the voltage input $V_2$ to the voltage input $V_3$. Note that the voltage generators 120 and 130 can act as a negative feedback circuit 108 that is configured to control the voltage input $V_1$. For example, the negative feedback circuit 108 can control the voltage input $V_1$ to be equal to the voltage input $V_2$. The negative feedback circuit 108 can operate together with the amplifier circuit 110 to lock the voltage gain of the voltage generator 120 (i.e. the ratio of the voltage input $V_1$ to the voltage input $V_3$) to the ratio of the voltage input $V_2$ to the voltage input $V_3$.

In the present embodiment, the voltage generator 130 can be further configured to provide the voltage input $V_2$. The voltage generator 130 can adjust at least one of the voltage input $V_2$ and the voltage input $V_3$, thereby adjusting the ratio of the voltage input $V_1$ to the voltage input $V_3$.

In operation, the voltage generator 130 can generate the voltage inputs $V_2$ and $V_3$. The voltage generator 120, biased by the bias voltage $V_B$, can amplify the voltage input $V_3$ by a voltage gain to generate the voltage input $V_1$. The negative feedback circuit 108 can operate together with the amplifier circuit 110 to lock the voltage gain according to the ratio of the voltage input $V_2$ to the voltage input $V_3$. Note that direct current (DC) biasing of the main circuit 102 can be the same as DC biasing of the voltage generator 120. For example, a bias point of a transistor in the main circuit 102 can be the same or substantially the same as a bias point of a corresponding transistor in the voltage generator 120. These two transistors can have the same transconductance. Thus, when a transconductance of the voltage generator 120 is kept constant, the main circuit 102 can have a constant transconductance. For example, a ratio of an output current to an input voltage of the main circuit 102 can be kept constant.

By locking or controlling a gain of a voltage generator that is supplied with a bias voltage of a main circuit, the proposed bias scheme can reduce the influence of PVT variations on a chip gain, thereby decreasing the cost of measurement and calibration for a single chip. In addition, the proposed bias scheme can effectively reduce the gain variations across mass-produced chips, thus decreasing system calibration cost.

To facilitate understanding of the present disclosure, some embodiments are given as follows for further description of the proposed bias scheme. Those skilled in the art should appreciate that other embodiments employing the architecture shown in FIG. 1 are also within the contemplated scope of the present disclosure.

Figure 2:
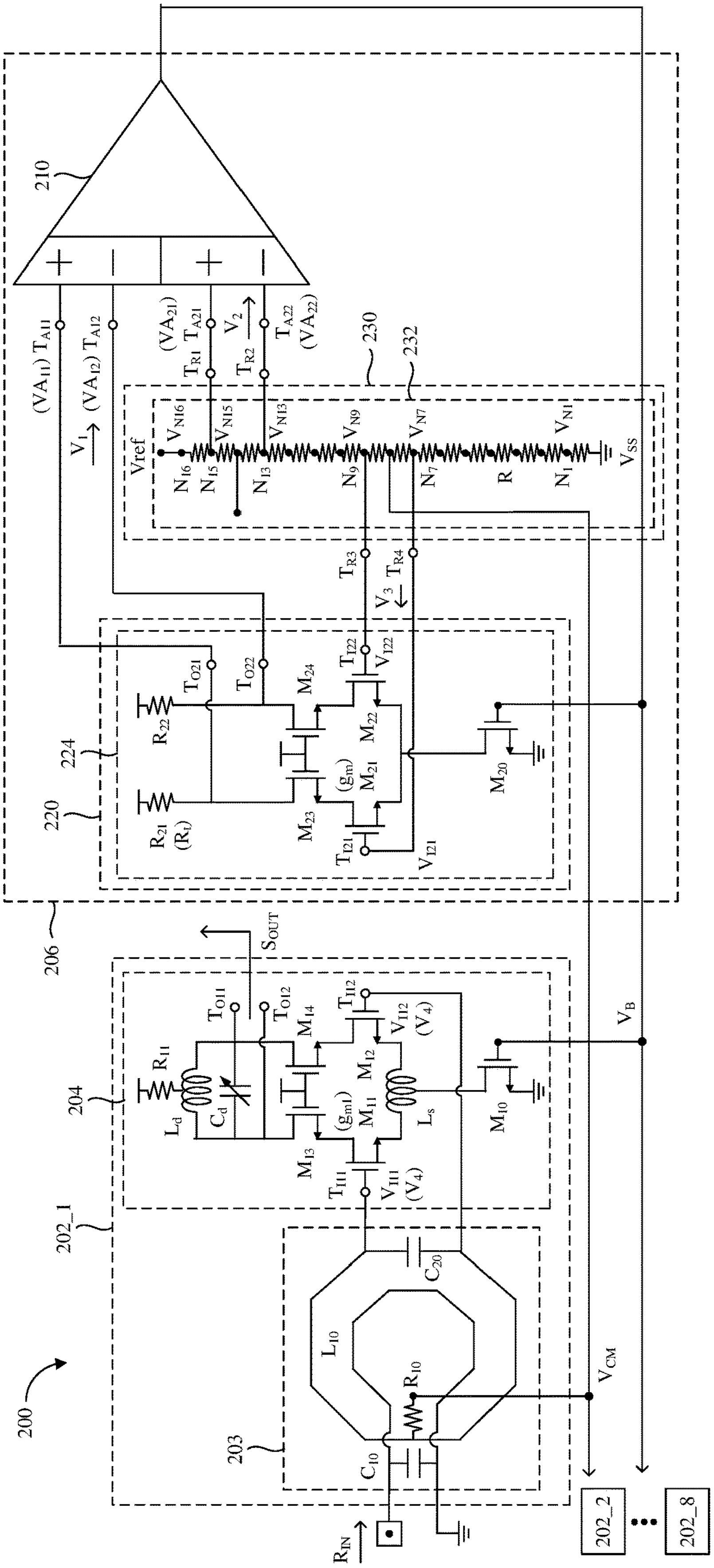
FIG. 2 illustrates an implementation of the signal generator circuit shown in FIG. 1 in accordance with some embodiments of the present disclosure.

FIG. 2 illustrates an implementation of the signal generator circuit 100 shown in FIG. 1 in accordance with some embodiments of the present disclosure. The signal generator circuit 200 includes a main circuit 202_1 and a bias voltage generating circuit 206, which can represent embodiments of the main circuit 102 and the bias voltage generating circuit 106 shown in FIG. 1 respectively.

In the present embodiment, the main circuit 202_1 may be implemented using a radio frequency (RF) small-signal differential low-noise amplifier (LNA). The main circuit 202_1 can be configured to receive an RF input signal $R_{IN}$ and a reference signal (i.e. a common-mode voltage $V_{CM}$) to generate a voltage input $V_4$, and amplify the voltage input $V_4$ to generate the output signal Sour. The RF input signal $R_{IN}$ can serve as an embodiment of the input signal $S_{IN}$ shown in FIG. 1.

The main circuit 202_1 includes, but is not limited to, an input matching network 203 and a differential pair 204. The input matching network 203 is coupled to the RF input signal $R_{IN}$ and the common-mode voltage $V_{CM}$, and arranged to output the voltage input $V_4$ to a pair of input terminals $T_{I11}$ and $T_{I12}$. The voltage input $V_4$ includes a pair of differential signals $V_{I11}$ and $V_{I12}$, and a common-mode component of the pair of the differential signals $V_{I11}$ and $V_{I12}$ is equal to or substantially equal to the common-mode voltage $V_{CM}$. In the example of FIG. 2, the input matching network 203 may include a capacitor $C_{10}$, a resistive element $R_{10}$, an inductor $L_{10}$ and a capacitor $C_{20}$. The input matching network 203 can be represented by an equivalent circuit having a resistive element $R_s$ and an inductor $L_g$ connected in series.

The differential pair 204 is biased by the bias voltage $V_B$, and arranged to amplify the voltage input $V_4$ to generate the output signal Sour (e.g. a voltage difference between the output terminals $T_{O11}$ and $T_{O12}$). In the example of FIG. 2, the differential pair 204 may include a plurality of transistors $M_{10}$-$M_{14}$, a plurality of inductors $L_s$ and $L_d$, a variable capacitor $C_d$ and a resistive element $R_{11}$.

The bias voltage generating circuit 206 includes an amplifier circuit 210, a voltage generator 220 and a voltage generator 230, which can represent embodiments of the amplifier circuit 110, the voltage generator 120 and the voltage generator 130 shown in FIG. 1 respectively. In the present embodiment, the amplifier circuit 210 can be implemented using a differential difference amplifier (DDA). The voltage input $V_1$ can represent a voltage difference between a pair of differential signals $V_{A11}$ and $V_{A12}$ inputted to a pair of input terminals $T_{A11}$ and $T_{A12}$; the voltage input $V_2$ can represent a voltage difference between a pair of differential signals $V_{A21}$ and $V_{A22}$ inputted to a pair of input terminals $T_{A21}$ and $T_{A22}$. The amplifier circuit 210 is configured to amplify a voltage difference between the voltage inputs $V_1$ and $V_2$ to generate the bias voltage $V_B$. Note that a common-mode voltage of respective voltage signals at the input terminals TAIL and $T_{A12}$ can be different from that of respective voltage signals at the input terminals $T_{A21}$ and $T_{A22}$. For example, the amplifier circuit 210 can be a DDA with a constant transconductance input stage.

The voltage generator 220 can be arranged to amplify a voltage difference between the input terminals $T_{I21}$ and $T_{I22}$ (i.e. the voltage input $V_3$) to generate the voltage input $V_1$ (i.e. a voltage difference between the output terminals $T_{O21}$ and $T_{O22}$). The voltage gain of the voltage generator 220 can be expressed as a product of a transconductance and a load resistance of the voltage generator 220. For example, the voltage generator 220 can be implemented using a differential pair 224, which may include a plurality of transistors $M_{20}$-$M_{24}$ and a plurality of resistive elements $R_{21}$ and $R_{22}$. The respective control terminals of the transistors $M_{21}$ and $M_{22}$ are coupled to the input terminals $T_{I21}$ and $T_{I22}$, respectively; the resistive elements $R_{21}$ and $R_{22}$ are coupled to the output terminals $T_{O21}$ and $T_{O22}$, respectively. The voltage gain of the voltage generator 220 can be expressed as $g_m R_t$, which represents a product of a transconductance $g_m$ and a load resistance $R_t$ of the voltage generator 220. The transconductance $g_m$ can be a transconductance of the transistor $M_{21}$, and the load resistance $R_t$ can be a resistance of the resistive element $R_{21}$.

In the embodiment shown in FIG. 2, the width-to-length (W/L) ratio of the transistor $M_{1i}$ in the differential pair 204 can be m times that of the transistor $M_{2i}$ in the differential pair 224, where i=0, . . . , 4. For example, the width of the transistor $M_{1i}$ is m times that of the transistor $M_{2i}$, while the length of the transistor $M_{1i}$ is equal to that of the transistor $M_{2i}$. In addition, the resistive elements $R_{21}$ and $R_{22}$ in the differential pair 224 have the same resistance $R_t$, which is 2 m times the resistance of the resistive element $R_{11}$ in the differential pair 204. The bias current of the differential pair 204 can be m times the bias current of the differential pair 224.

The voltage generator 230 can be configured to provide the voltage inputs $V_2$ and $V_3$, and adjust a ratio of the voltage input $V_2$ to the voltage input $V_3$. The voltage generator 230 can operate together with the voltage generator 220 to provide a negative feedback path to thereby control the voltage input $V_1$ to be equal to the voltage input $V_2$. In addition, the voltage generator 230 can be configured to provide a common-mode component of the voltage input $V_3$ to the main circuit 202_1. The common-mode component of the voltage input $V_3$ can serve as the common-mode voltage $V_{CM}$.

For example, the voltage generator 230 may include a resistor ladder 232 and a plurality of output terminals $T_{R1}$-$T_{R4}$. The resistor ladder 232 includes a set of resistors and a set of nodes. The set of resistors includes a plurality of resistors R connected in series between a reference voltage Vref and a reference voltage $V_{SS}$ (e.g. a ground voltage). The resistors R can have a same resistance. The set of nodes may include a plurality of nodes $N_1$-$N_{16}$, and can be arranged to provide a set of node voltages $V_{N1}$-$V_{N16}$ according to the reference voltage Vref and the reference voltage $V_{SS}$.

The output terminal $T_{R1}$ can be coupled to a first node in the set of nodes, and the output terminal $T_{R2}$ can be coupled to a second node in the set of nodes. The voltage difference between the first node and the second node can serve as the voltage input $V_2$. Similarly, the output terminal $T_{R3}$ can be coupled to a third node in the set of nodes, and the output terminal $T_{R4}$ can be coupled to a fourth node in the set of nodes. The voltage difference between the third node and the fourth node can serve as the voltage input $V_3$. Note that a node voltage at a middle node, which is located between the third node and the fourth node, can be provided to the main circuit 202_1 to serve as the common-mode voltage $V_{CM}$. The node voltage at the middle node can be equal to or substantially equal to an average of the respective node voltages at the third and the fourth nodes. In other words, the voltage generator 230 can provide a common-mode component of the voltage input $V_3$ to the main circuit 202_1.

In operation, the output terminals $T_{R3}$ and $T_{R4}$ can be coupled to the nodes $N_9$ and $N_7$, respectively. The voltage difference between the node voltages $V_{N9}$ and $V_{N7}$, i.e. ($\frac{9}{16}$>Vref-$\frac{7}{16}$Vref), is used as the voltage input $V_3$. The differential pair 224 can amplify the voltage input $V_3$ to generate the voltage input $V_1$, which can be determined by the expression $V_1=g_m R_t \times V_3$. In addition, the output terminals $T_{R1}$ and $T_{R2}$ can be coupled to the nodes $N_{15}$ and $N_{13}$, respectively. The voltage difference between the node voltages $V_{N15}$ and $V_{N13}$, i.e. ($\frac{15}{16}$Vref-$\frac{13}{16}$Vref), is used as the voltage input $V_2$. When the voltage input $V_1$ is equal to or substantially equal to the voltage input $V_2$, the voltage gain of the voltage generator 220 can be determined by the expression $g_m R_t \times V_3 = V_2$. Thus, the voltage gain (i.e. $g_m R_t$) can be locked to $V_2/V_3$, which equals 1 in the example of FIG. 2.

Note that the voltage inputs $V_2$ and $V_3$ can be represented by X/16Vref and Y/16Vref, respectively, where X represents the number of resistors connected between the output terminals $T_{R1}$ and $T_{R2}$, and Y represents the number of resistors connected between the output terminals $T_{R3}$ and $T_{R4}$. The voltage gain $g_m R_t$ is equal to X/Y, which is insensitive to (or unaffected by) resistance variations in the resistor R and voltage variations in the reference voltage Vref. In other words, the voltage gain $g_m R_t$ can be locked to a constant value X/Y. The bias voltage generating circuit 206 can be referred to as a constant-$g_m R_t$ bias circuit.

In addition, the transconductance $g_m$ (e.g. the transconductance of the transistor $M_{21}$) can be locked to a constant value. For example, the transconductance $g_m$ can be locked to a constant value when the load resistance $R_t$ (e.g. the resistance of the resistive element $R_{21}$) is a constant. As another example, the transconductance $g_m$ can be locked to a constant value when $V_2/V_3$ varies with a change in the load resistance $R_t$.

In the present embodiment, the equivalent transconductance $G_m$ of the main circuit 202_1 can be determined by the following expression:

$$G_m = jg_{m1}\frac{\sqrt{(L_s+L_g)C_{gs}}}{\left(\frac{g_{m1}L_s}{C_{gs}}+R_s\right)C_{gs}},$$

where $g_{m1}$ and $C_{gs}$ represent a transconductance and an intrinsic gate-to-source capacitance of the transistor $M_{11}$, respectively. When the transconductance $g_{m1}$ of the transistor $M_{11}$ is a constant, the equivalent transconductance $G_m$ of the main circuit 202_1 can be kept constant. For example, the DC biasing of the differential pair 204 can be the same as that of the differential pair 224. The transconductance $g_{m1}$ of the transistor $M_{11}$ can be a constant when the transconductance of the transistor $M_{21}$ (i.e. $g_m$) is locked to a constant value.

Compared with the constant-voltage bias scheme and the constant-current bias scheme, the proposed bias scheme can effectively reduce the influence of PVT variations on the chip gain. For example, referring firstly to FIG. 3A, consider a case where a constant voltage $V_{BG}$ is applied to the transistor $M_{10}$ shown in FIG. 2. The constant voltage $V_{BG}$ can be provided by a bandgap voltage reference. In the example of FIG. 3A, the associated transconductance $G_{mA}$ is proportional to the electron mobility $\mu_n$ and a difference between the constant voltage $V_{BG}$ and the threshold voltage VTH of the transistor $M_{11}$:

$$G_{mA} = \frac{\Delta I}{\Delta V} = \frac{I_1 - I_2}{V_{G1} - V_{G2}} \propto \mu_n(V_{BG} - V_{TH}).$$

Figure 3B:
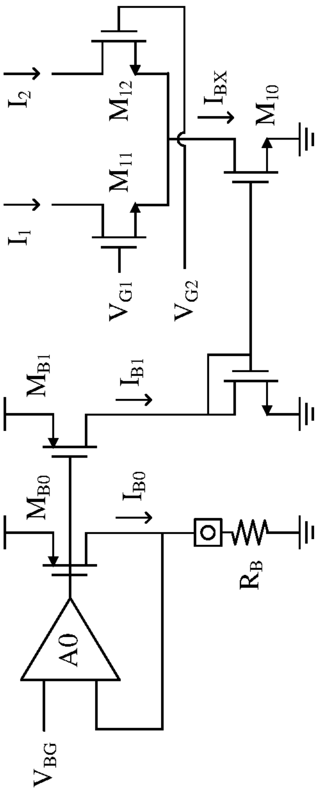
FIG. 3B illustrates a constant-current bias scheme in accordance with some embodiments.
Figure 3A:
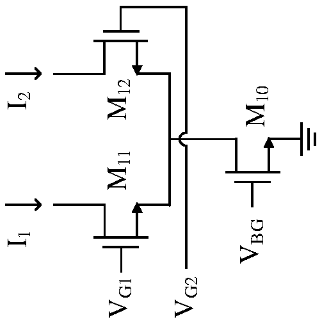
FIG. 3A illustrates a constant-voltage bias scheme in accordance with some embodiments.

Referring to FIG. 3B, consider a case where a constant current $I_{BX}$ is applied to the transistor $M_{10}$ shown in FIG. 2. The constant current $I_{BX}$ can be provided by a constant current generator which includes an operational amplifier A0, a transistor $M_{B0}$, a resistor $R_B$ and a transistor $M_{B1}$. The resistor $R_B$ can be an off-chip resistor or a high precision resistor. The constant voltage $V_{BG}$, provided by a bandgap voltage reference, is applied to the operation amplifier A0 to provide constant currents $I_{B0}$ and $I_{B1}$. The constant current $I_{B1}$ flowing through the transistor $M_{B1}$ is mirrored to the transistor $M_{10}$ to thereby produce the constant current $I_{BX}$. In the example of FIG. 3B, the associated transconductance $G_{mB}$ is proportional to the square root of the electron mobility $\mu_n$:

$$G_{mB} = \frac{\Delta I}{\Delta V} = \frac{I_1 - I_2}{V_{G1} - V_{G2}} \propto \sqrt{\mu_n}.$$

In view of the above, the main circuit 202_1 shown in FIG. 2, when biased using the constant-voltage bias scheme or the constant-current bias scheme, would have a transconductance which is easily affected by PVT variations. In contrast, with the use of the proposed constant-$g_m$Rt bias scheme, the main circuit 202_1 shown in FIG. 2 can have a transconductance that can be unaffected by PVT variations.

The proposed bias scheme can be applied to various types of main circuits to maintain a constant or controllable transconductance. For example, referring to FIG. 4, another implementation of the signal generator circuit 100 shown in FIG. 1 is illustrated in accordance with some embodiments of the present disclosure. The circuit topology of the signal generator circuit 400 is identical/similar to that of the signal generator circuit 200 shown in FIG. 2 except for the main circuit 402. In the present embodiment, the main circuit 402 can be implemented using a low-frequency small-signal differential amplifier. The main circuit 402 includes, but is not limited to, the transistors $M_{10}$-$M_{14}$ shown in FIG. 2, and the resistive elements $R_{41}$ and $R_{42}$. Each of the resistive elements $R_{41}$ and $R_{42}$ has a resistance 1/m times that of the resistive element $R_{21}/R_{22}$. The common-mode voltage $V_{CM}$ provided from the bias voltage generating circuit 206 can serve as a common-mode component of the input signal $S_{IN}$ (i.e. a common-mode component of the pair of differential signals $V_{I21}$ and $V_{I22}$) applied to the transistors $M_{11}$ and $M_{12}$.

As those skilled in the art can appreciate the operation of the signal generator circuit 400 after reading the above paragraphs directed to FIG. 1 and FIG. 2, further description is omitted here for brevity.

Figure 5:
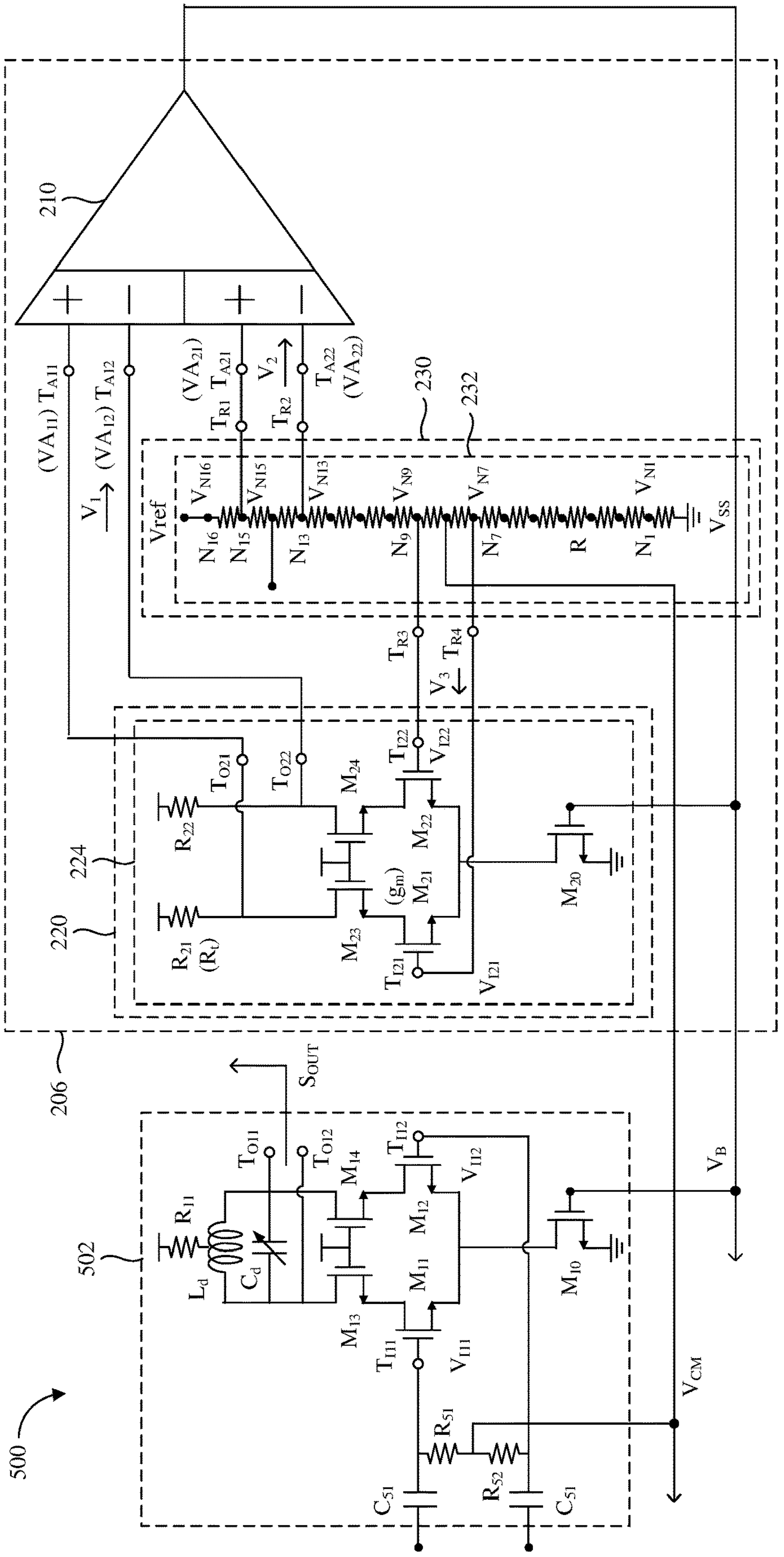
FIG. 5 illustrates another implementation of the signal generator circuit shown in FIG. 1 in accordance with some embodiments of the present disclosure.

Referring to FIG. 5, another implementation of the signal generator circuit 100 shown in FIG. 1 is illustrated in accordance with some embodiments of the present disclosure. The circuit topology of the signal generator circuit 500 is identical/similar to that of the signal generator circuit 200 shown in FIG. 2 except for the main circuit 502. In the present embodiment, the main circuit 502 can be implemented using an RF small-signal differential tuned amplifier. The main circuit 502 may include the transistors $M_{10}$-$M_{14}$, the inductor $L_d$, the variable capacitor $C_d$ and the resistive element $R_{11}$ shown in FIG. 2, and further includes the resistive elements $R_{51}$ and $R_{52}$ and the capacitors $C_{51}$ and $C_{52}$. A differential input signal is inputted to the transistors $M_{11}$ and $M_{12}$ through the capacitors $C_{51}$ and $C_{52}$. The common-mode voltage $V_{CM}$ provided from the bias voltage generating circuit 206 can be applied to the transistors $M_{11}$ and $M_{12}$ through the resistive elements $R_{51}$ and $R_{52}$, respectively.

As those skilled in the art can appreciate the operation of the signal generator circuit 500 after reading the above paragraphs directed to FIG. 1 and FIG. 2, further description is omitted here for brevity.

In some embodiments, the proposed bias scheme can be used for a main circuit having single-ended circuit structure. For example, referring to FIG. 6, an implementation of the signal generator circuit 100 shown in FIG. 1 is illustrated in accordance with some embodiments of the present disclosure. The circuit topology of the signal generator circuit 600 is identical/similar to that of the signal generator circuit 200 shown in FIG. 2 except for the main circuit 602.

Figure 6:
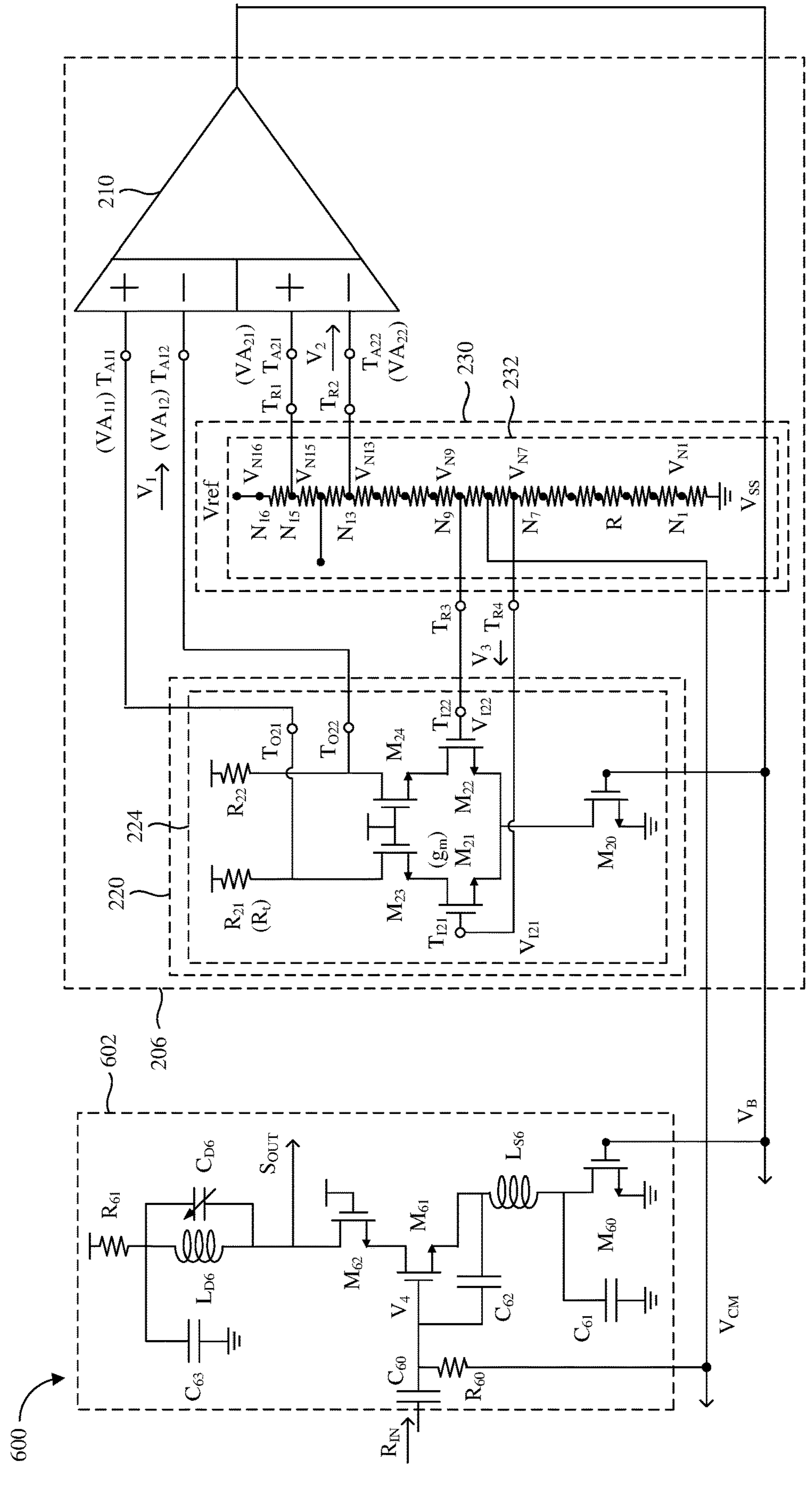
FIG. 6 illustrates another implementation of the signal generator circuit shown in FIG. 1 in accordance with some embodiments of the present disclosure.

In the embodiment shown in FIG. 6, the main circuit 602 can be implemented using an RF small-signal single-ended LNA. The main circuit 602 is configured to receive the RF input signal $R_{IN}$ and a reference signal (i.e. the common-mode voltage $V_{CM}$) to generate the voltage input $V_4$, and amplify the voltage input $V_4$ to generate the output signal Sour. The main circuit 602 may include the transistors $M_{60}$-$M_{62}$, the capacitors $C_{60}$-$C_{63}$, the resistive elements $R_{60}$ and $R_{61}$, the inductors $L_{S6}$ and $L_{D6}$, and a variable capacitor $C_{D6}$. The W/L ratio of the transistor $M_{60}$ can be m times that of the transistor $M_{20}$, the W/L ratio of the transistor $M_{61}$ can be 2 m times that of the transistor $M_{21}$, and W/L ratio of the transistor $M_{62}$ can be 2 m times that of the transistor $M_{23}$. In addition, the resistance of the resistive element $R_{61}$ can be ½m times that of the resistive element $R_{11}$. The RF input signal $R_{IN}$ is coupled to the capacitor $C_{60}$ to produce an alternating current (AC) component of the voltage input $V_4$ applied to the transistor $M_{61}$. The common-mode voltage $V_{CM}$, provided by the bias voltage generating circuit 206, is coupled to the resistive element $R_{60}$ to provide a DC component of the voltage input $V_4$.

As those skilled in the art can appreciate the operation of the signal generator circuit 600 after reading the above paragraphs directed to FIG. 1 and FIG. 2, further description is omitted here for brevity.

Figure 7:
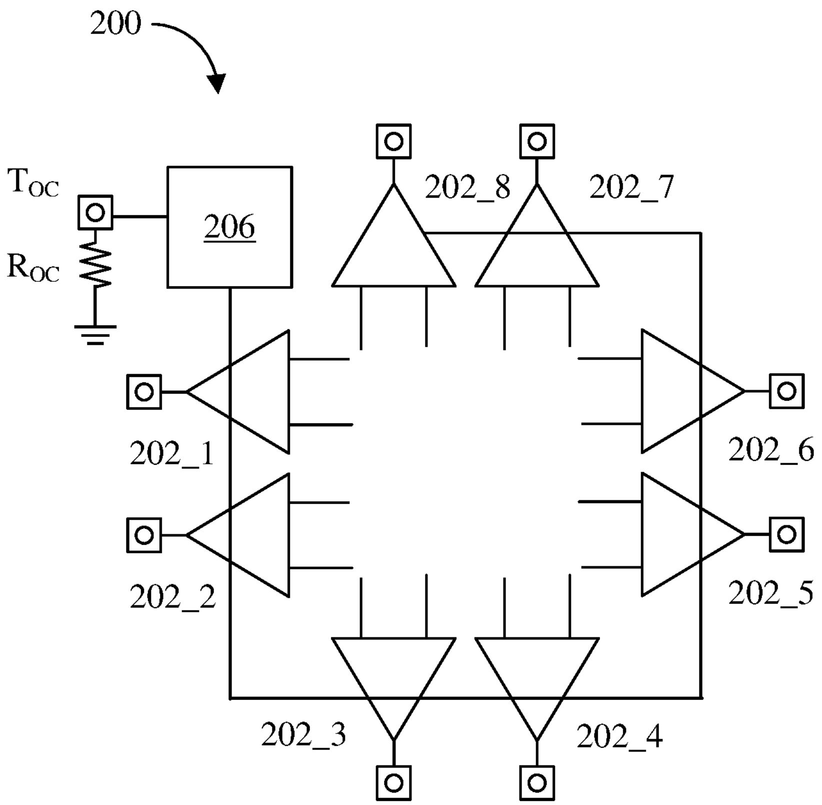
FIG. 7 illustrates another implementation of the signal generator circuit shown in FIG. 1 in accordance with some embodiments of the present disclosure.

In some embodiments, the proposed bias scheme can utilize a single bias voltage generating circuit to bias more than one main circuit. Referring to FIG. 7 and also to FIG. 2, the single bias voltage generating circuit 206 can be shared by the main circuits 202_1-202_8. By way of example but not limitation, each of the main circuits 202_2-202_8 can be implemented using an RF small-signal differential LNA, which can have a circuit topology identical to that of the main circuit 202_1. The bias voltage generating circuit 206 can further supply both of the bias voltage $V_B$ and the common-mode voltage $V_{CM}$ to the main circuits 202_2-202_8, thereby reducing the overall power consumption of the signal generator circuit 200. In addition, by locking a product of the transconductance $g_m$ and the load resistance $R_t$ of the bias voltage generating circuit 206 to a predetermined value, the proposed bias scheme can keep a transconductance of each main circuit constant.

In the embodiment shown in FIG. 7, the bias voltage generating circuit 206 can be coupled to an external resistive element $R_{OC}$, which can be a high precision resistor or an off-chip resistor located outside the bias voltage generating circuit 206. The bias voltage generating circuit 206 can be configured to measure or detect the load resistance according to a reference voltage at the reference terminal $T_{OC}$. When the load resistance is temperature independent, the bias voltage generating circuit 206 can measure the load resistance only once; when the load resistance is temperature dependent, the bias voltage generating circuit 206 can measure the load resistance multiple times to trace the load resistance. As a product of the transconductance $g_m$ and the load resistance $R_t$ can be locked to a predetermined value, the bias voltage generating circuit 206 can control the transconductance according to the predetermined value and the measured load resistance.

Figure 8:
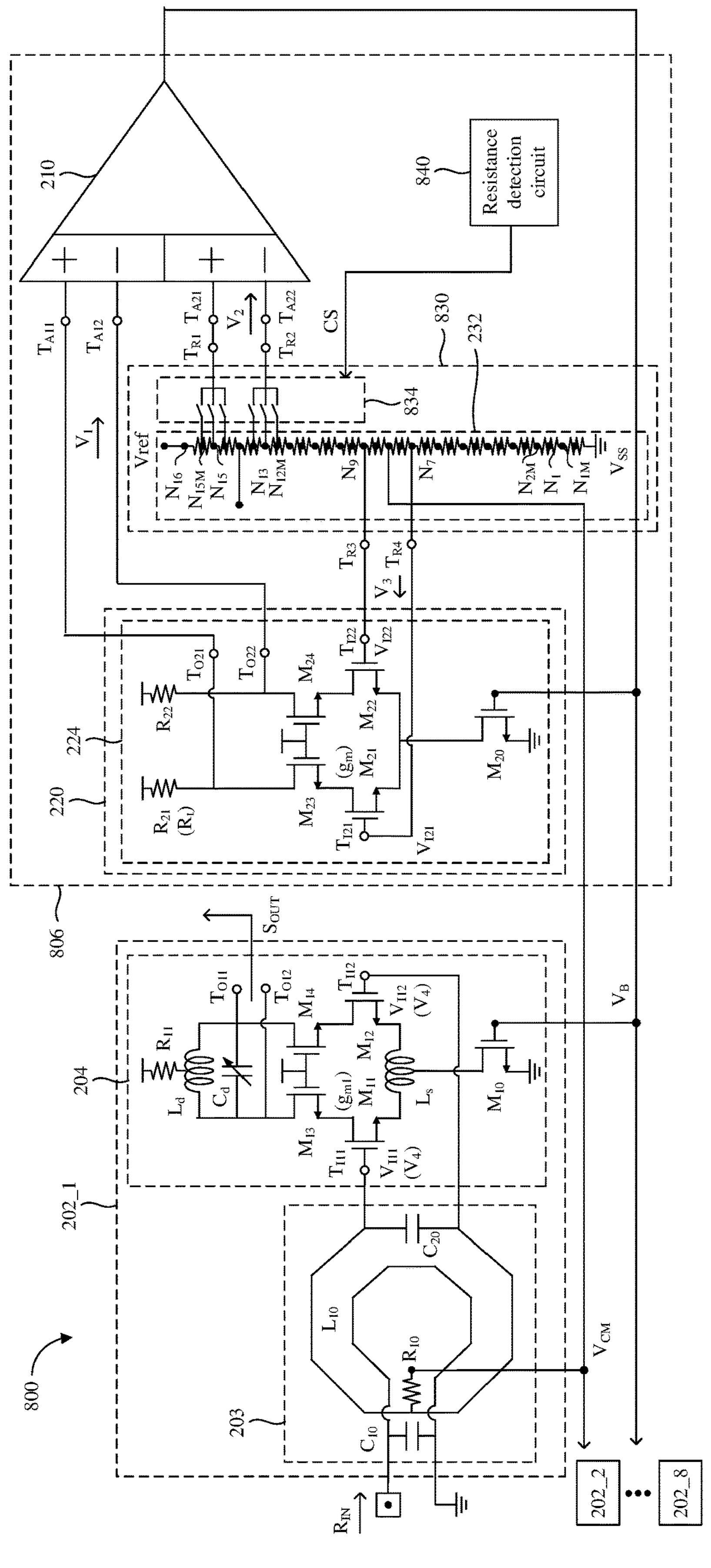
FIG. 8 illustrates another implementation of the signal generator circuit shown in FIG. 1 in accordance with some embodiments of the present disclosure.

FIG. 8 illustrates another implementation of the signal generator circuit 100 shown in FIG. 1 in accordance with some embodiments of the present disclosure. The structure of the signal generator circuit 800 is substantially identical/similar to that of the signal generator circuit 200 shown in FIG. 2 except that the bias voltage generating circuit 806 includes a resistance detection circuit 840. The resistance detection circuit 840, coupled to the voltage generator 830, can be configured to detect the load resistance $R_t$ of the voltage generator 220 to generate a control signal CS. The voltage generator 830 can be configured to adjust the ratio of the voltage input $V_2$ to the voltage input $V_3$ according to the control signal CS, thereby adjusting the product of the transconductance $g_m$ and the load resistance $R_t$ (i.e. $g_mR_t$). As the value of load resistance $R_t$ can be measured and the value of the product $g_mR_t$ is controllable, the proposed bias scheme can control the transconductance $g_m$ to reach a target value. For example, when the ratio of the voltage input $V_2$ to the voltage input $V_3$ (equivalent to the product $g_mR_t$) can change in response to a change in the load resistance $R_t$, the transconductance $g_m$ can be kept constant.

In the present embodiment, the voltage generator 830 includes, but is not limited to, the resistor ladder 232 shown in FIG. 2 and a selection circuit 834. The selection circuit 834 can be configured to select one from among a set of nodes in the resistor ladder 232 according to the control signal CS, and couple the selected node to an output terminal, thereby providing a node voltage at the selected node to the amplifier circuit 210 through the output terminal.

For example, the set of nodes in the resistor ladder 232 may include the nodes $N_1$-$N_{16}$ and $N_{1M}$-$N_{15M}$, and the node $N_{iM}$ is substantially the midpoint between the nodes $N_i$ and N(i+n), where i=1, 2, . . . , 15. The node voltage at the node $N_{iM}$ is substantially an average of the node voltage at the node $N_i$ and the node voltage at the node $N_{(i+1)}$. The selection circuit 834 can couple a first node and a second node in the set of nodes to the output terminals $T_{R1}$ and $T_{R2}$, respectively, thereby providing the voltage input $V_2$ (i.e. a voltage difference between the first node and the second node) to the amplifier circuit 210.

In operation, the resistance detection circuit 840 can detect that the load resistance $R_t$ is equal to a first value. The selection circuit 834 can couple the nodes $N_{15}$ and $N_{13}$ to the output terminals $T_{R1}$ and $T_{R2}$ respectively, such that the voltage gain of the voltage generator 220 (i.e. $g_mR_t$) can be locked to one. The value of the transconductance $g_m$ can be equal to an inverse of the first value. When the resistance detection circuit 840 detects that the load resistance $R_t$ increases to a second value which is P times the first value, the selection circuit 834 can control the product $g_mR_t$ to be equal to P, thereby keeping the value of the transconductance $g_m$ constant. For example, the selection circuit 834 can couple the nodes $N_{15M}$ and $N_{12M}$ to the output terminals $T_{R1}$ and $T_{R2}$, respectively, according to the control signal CS when the second value is 1.5 times the first value. In other words, when the value of the load resistance $R_t$ is obtained, the voltage generator 830 can adjust the voltage input $V_2$ to make the transconductance $g_m$ reach a target value.

Some implementations of the resistance detection circuit 840 are given as follows for illustrative purposes. However, this is not intended to be limiting. The resistance detection circuit 840 can be implemented using other circuit structures without departing from the scope of the present disclosure.

Figure 9:
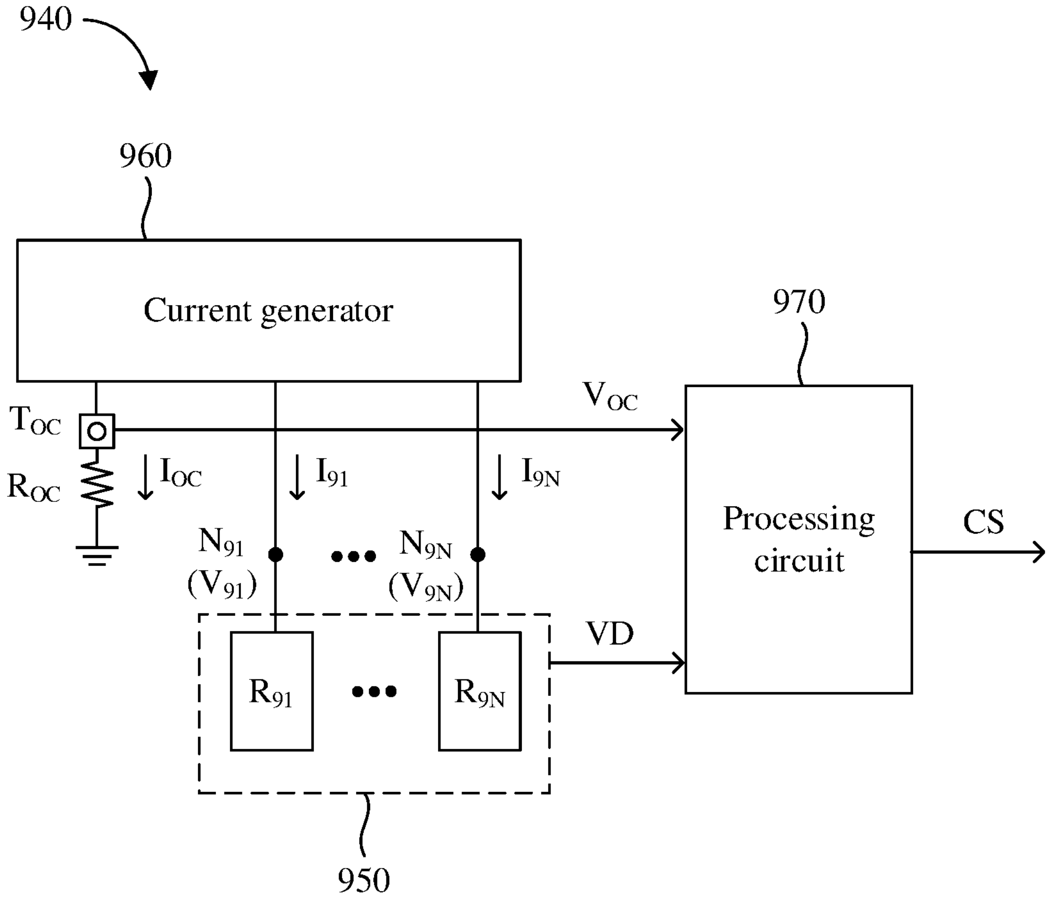
FIG. 9 illustrates an implementation of the resistance detection circuit shown in FIG. 8 in accordance with some embodiments of the present disclosure.

FIG. 9 illustrates an implementation of the resistance detection circuit 840 shown in FIG. 8 in accordance with some embodiments of the present disclosure. The resistance detection circuit 940 includes, but is not limited to, a resistive network 950, a current generator 960 and a processing circuit 970. The resistive network 950 includes N resistive elements $R_{91}$-$R_{9N}$ that are coupled to N connection nodes $N_{91}$-$N_{9N}$ respectively, where N is a positive integer. The resistance of each resistive element can change in response to a change in a load resistance, such as the load resistance $R_t$ of the voltage generator 220 shown in FIG. 8. By way of example but not limitation, each resistive element and the resistive element $R_{21}/R_{22}$ shown in FIG. 8 are fabricated using the same process and formed in the same chip. A change in resistance of each resistive element can reflect, or is related to, a change in resistance of the resistive element $R_{21}/R_{22}$. In addition, the resistive network 950 can be configured to generate a detection voltage VD according to N input voltages $V_{91}$-$V_{9N}$ at the N connection nodes $N_{91}$-$N_{9N}$.

The current generator 960 is coupled to the N connection nodes $N_{91}$-$N_{9N}$, and coupled to the external resistive element $R_{OC}$ through the reference terminal $T_{OC}$. The current generator 960 can be configured to generate N currents $I_{91}$-$I_{9N}$ according to a reference current $I_{OC}$ flowing through the external resistive element $R_{OC}$. The N currents $I_{91}$-$I_{9N}$ can flow through the N resistive elements $R_{91}$-$R_{9N}$ to generate the N input voltages $V_{91}$-$V_{9N}$ at the N connection nodes $N_{91}$-$N_{9N}$, respectively. For example, the reference current $I_{OC}$ can be unaffected by (or insensitive to) PVT variations. The current generator 960 can be configured to mirror the reference current $I_{OC}$ to produce the N currents $I_{91}$-$I_{9N}$.

The processing circuit 970, coupled to the resistive network 950 and the reference terminal $T_{OC}$, can be configured to generate the control signal CS according to the detection voltage VD and a reference voltage $V_{OC}$ at the reference terminal $T_{OC}$. For example, the processing circuit 970 can generate the control signal CS by comparing the detection voltage VD with the reference voltage $V_{OC}$.

Figure 10A:
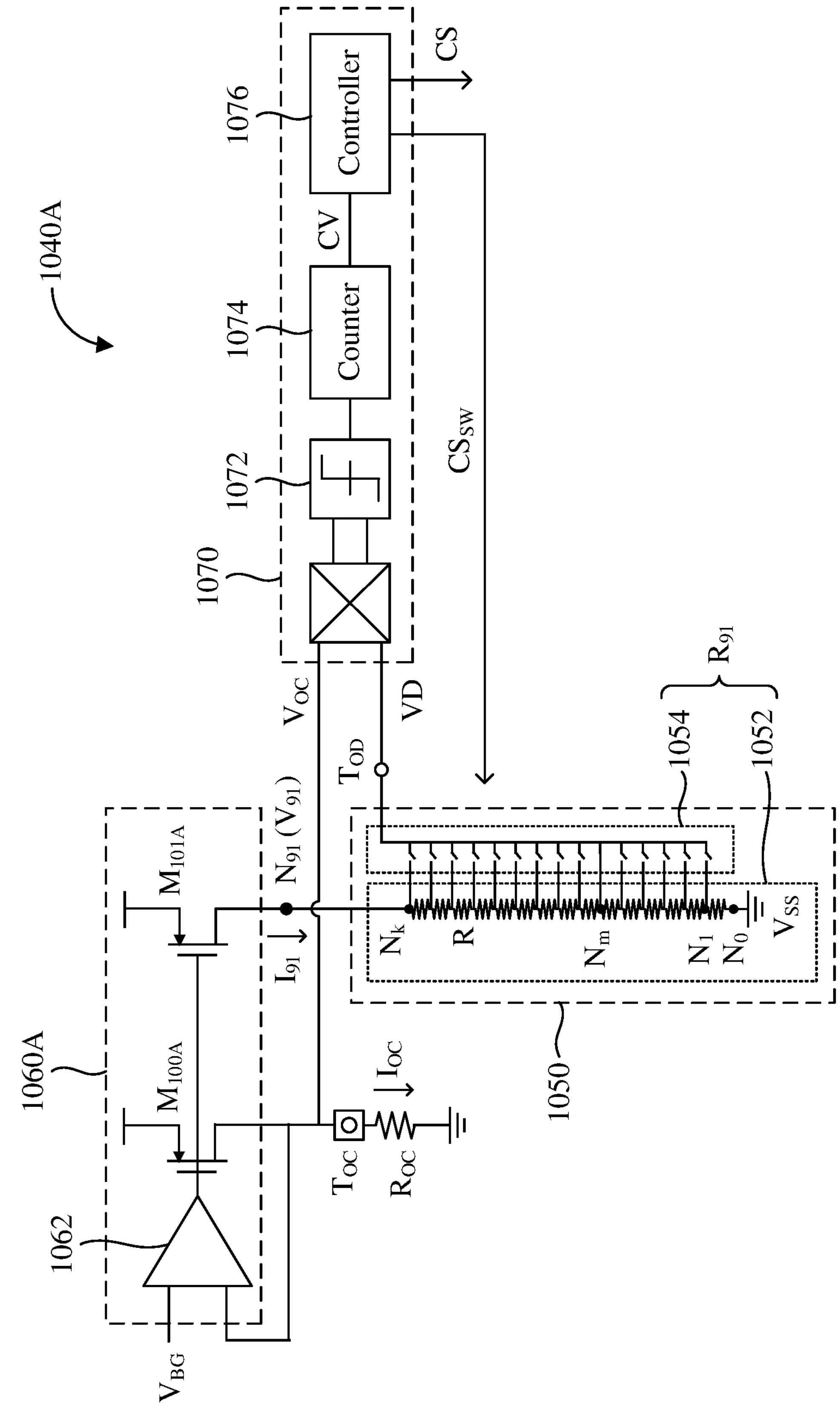
FIG. 10A illustrates an implementation of the resistance detection circuit shown in FIG. 9 in accordance with some embodiments of the present disclosure.

FIG. 10A illustrates an implementation of the resistance detection circuit 940 shown in FIG. 9 in accordance with some embodiments of the present disclosure. The resistance detection circuit 1040A includes a resistive network 1050, a current generator 1060A and a processing circuit 1070, which can represent embodiments of the resistive network 950, the current generator 960 and the processing circuit 970 shown in FIG. 9 respectively.

In the present embodiment, the resistive network 1050 utilizes one resistive element $R_{91}$ (i.e. N=1) to produce the detection voltage VD. The resistive element $R_{91}$ includes, but is not limited to, a resistor ladder 1052 and a selection circuit 1054. The resistor ladder 1052 may include a set of resistors and a set of nodes. The set of resistors includes a plurality of resistors R connected in series between the connection node $N_{91}$ and a reference voltage $V_{SS}$ (e.g. a ground voltage). The resistance of each resistor R is equal to 1/n times the load resistance $R_t$, where n is a natural number. For example, when the load resistance $R_t$ is much greater than the resistance of the external resistive element $R_{OC}$, n can be a number that is greater or much greater than one. In addition, the set of nodes includes a plurality of nodes $N_0$-$N_k$ (k is a positive integer greater than one), and is arranged to provide a set of node voltages $V_{N1}$-$V_{Nk}$ according to the input voltage $V_{91}$ at the connection node $N_{91}$ and the reference voltage $V_{SS}$.

The selection circuit 1054 can be configured to select one from among the set of nodes, and couple the selected node to the processing circuit 1070. The node voltage at the selected node serves as the detection voltage VD. For example, the selection circuit 1054 can include k switches, each of which is selectively coupled between a corresponding node and an output terminal $T_{OD}$. When one of the k switches is switched on, the others are switched off.

The current generator 1060A includes, but is not limited to, an amplifier 1062, a transistor $M_{100A}$ and a transistor $M_{101A}$. The reference voltage $V_{OC}$ at the reference terminal $T_{OC}$ is equal to or substantially equal to a reference voltage $V_{BG}$, which can be provided by a bandgap voltage reference. In the example of FIG. 10A, the current $I_{91}$ flowing through the transistor $M_{101A}$ can be equal to or substantially equal to the reference current $I_{OC}$ flowing through the transistor $M_{100A}$.

The processing circuit 1070 can be configured to generate the control signal CS by comparing the detection voltage VD with the reference voltage $V_{OC}$. For example, the processing circuit 1070 may include a comparator 1072, a counter 1074 and a controller 1076. The comparator 1072 is configured to compare the reference voltage $V_{OC}$ at the reference terminal $T_{OC}$ and the detection voltage VD at the output terminal $T_{OD}$. The counter 1074 is configured to generate a count value CV indicating a difference between the reference voltage $V_{OC}$ and the detection voltage VD. The controller 1076 can be configured to generate the control signals $CS_{SW}$ and CS according to the count value CV. The control signal $CS_{SW}$ is provided for controlling the selection circuit 1054, and the control signal CS is provided for controlling the selection circuit 834 shown in FIG. 8.

Consider an example where the node $N_m$ is selected and the count value CV indicates that the detection voltage VD is equal to or substantially equal to the reference voltage $V_{OC}$. The load resistance $R_t$ can be determined by the expression:

$$I_{OC} \times R_{OC} = I_1 \times \frac{m}{n} R_t.$$

When the reference current $I_{OC}$ and the current $I_1$ have the same level, the load resistance $R_t$ can be determined by the expression $R_t$=n/m$R_{OC}$. In some embodiments, the load resistance $R_t$ can be measured or calibrated only once when it is temperature independent. In some embodiments, the load resistance $R_t$ can be measured or calibrated multiple times to trace a change in resistance when it is temperature dependent.

Figure 10B:
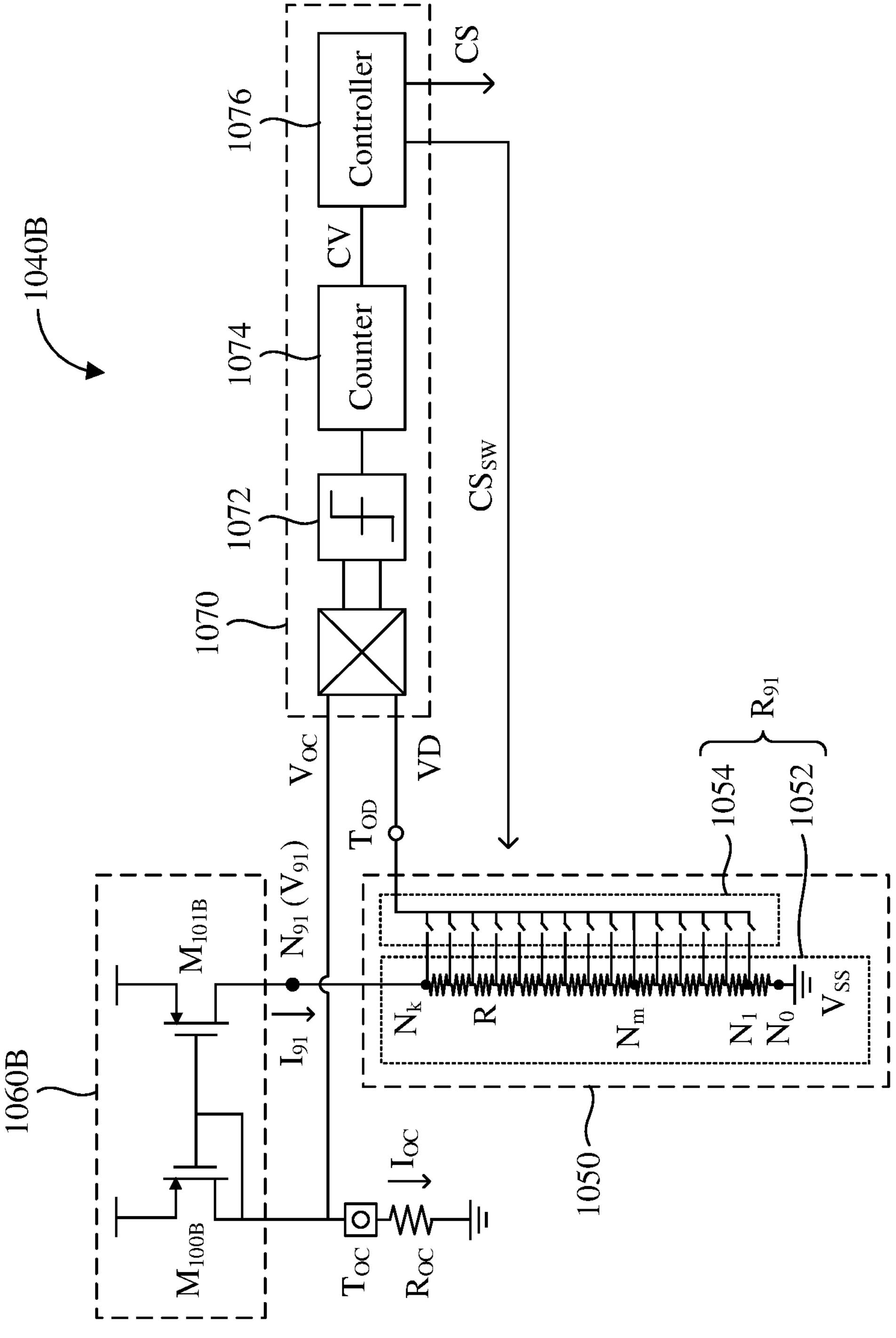
FIG. 10B illustrates another implementation of the resistance detection circuit shown in FIG. 9 in accordance with some embodiments of the present disclosure.

FIG. 10B illustrates another implementation of the resistance detection circuit 940 shown in FIG. 9 in accordance with some embodiments of the present disclosure. The circuit topology of the resistance detection circuit 1040B is identical/similar to that of the resistance detection circuit 1040A shown in FIG. 10A except for the current generator 1060B. In the present embodiment, the current generator 1060B may be implemented using the transistors $M_{100B}$ and $M_{100B}$. The current $I_{91}$ flowing through the transistor $M_{101B}$ can be equal to or substantially equal to the reference current $I_{OC}$ flowing through the transistor $M_{100B}$. As those skilled in the art can appreciate the operation of the resistance detection circuit 1040B after reading the above paragraphs directed to FIG. 10A, further description is omitted here for brevity.

Figure 11A:
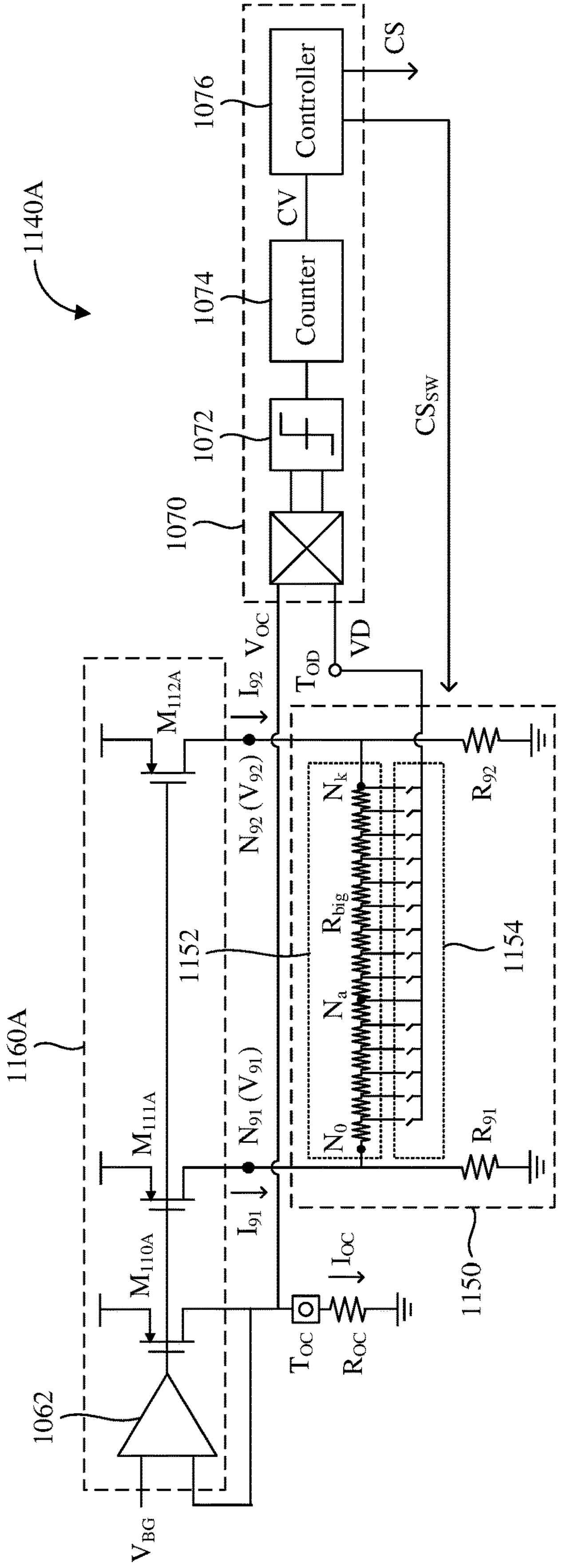
FIG. 11A illustrates another implementation of the resistance detection circuit shown in FIG. 9 in accordance with some embodiments of the present disclosure.

FIG. 11A illustrates another implementation of the resistance detection circuit 940 shown in FIG. 9 in accordance with some embodiments of the present disclosure. The circuit topology of the resistance detection circuit 1140A is identical/similar to that of the resistance detection circuit 1040A shown in FIG. 10A except for the resistive network 1150 and the current generator 1160A.

The resistive network 1150 can utilize the resistive elements $R_{91}$ and $R_{92}$ to produce the detection voltage VD. The resistance of the resistive element $R_{91}$ is different from the resistance of the resistive element $R_{92}$. In the present embodiment, the resistance of the resistive element $R_{91}$ is m times the load resistance $R_t$ (i.e. m×$R_t$), and the resistance of the resistive element $R_{92}$ is n times the load resistance $R_t$ (i.e. n×$R_t$), where m and n are different numbers. For example, when the load resistance $R_t$ is much less than the resistance of the external resistive element $R_{OC}$, both m and n can be numbers that are greater or much greater than one.

The resistive network 1150 further includes, but is not limited to, a resistor ladder 1152 and a selection circuit 1154. The resistor ladder 1152 may include a set of resistors and a set of nodes. The set of resistors includes a plurality of resistors $R_{big}$ connected in series between the connection nodes $N_{91}$ and $N_{92}$. The resistance of each resistor $R_{big}$ is much greater than the load resistance $R_t$. The set of nodes includes a plurality of nodes $N_0$-$N_k$ (k is a positive integer greater than one), and is arranged to provide a set of node voltages $V_{N1}$-$V_{Nk}$ according to the input voltage $V_{91}$ and the input voltage $V_{92}$. The selection circuit 1154 can be configured to select one from among the set of nodes, and couple the selected node to the processing circuit 1070. A node voltage at the selected node can serve as the detection voltage VD.

The current generator 1160A includes, but is not limited to, an amplifier 1162 and a plurality of transistors $M_{110A}$-$M_{112A}$. The reference voltage $V_{OC}$ at the reference terminal $T_{OC}$ is equal to or substantially equal to a reference voltage $V_{BG}$, which can be provided by a bandgap voltage reference. In the example of FIG. 11A, each of the current $I_{91}$ (flowing through the transistor $M_{111A}$) and the current $I_{92}$ (flowing through the transistor $M_{112A}$) can be equal to or substantially equal to the reference current $I_{OC}$ flowing through the transistor $M_{110A}$.

Consider an example where the node $N_a$ is selected and the count value CV indicates that the detection voltage VD is equal to or substantially equal to the reference $V_{OC}$. The load resistance $R_t$ can be determined by the expression:

$$I_{OC} \times R_{OC} = \frac{bR_{big}(I_1 \times mR_t) + aR_{big}(I_2 \times nR_t)}{R_{big}},$$

where a is a positive integer, and b is equal to (k−a). When the reference current $I_{OC}$, the current $I_1$ and the current $I_2$ have the same level, the load resistance $R_t$ can be determined by the expression $$R_t = \frac{a+b}{an+bm} R_{OC}.$$

In some embodiments, the load resistance $R_t$ can be measured or calibrated only once when it is temperature independent. In some embodiments, the load resistance $R_t$ can be measured or calibrated multiple times to trace a change in resistance when it is temperature dependent.

Figure 11B:
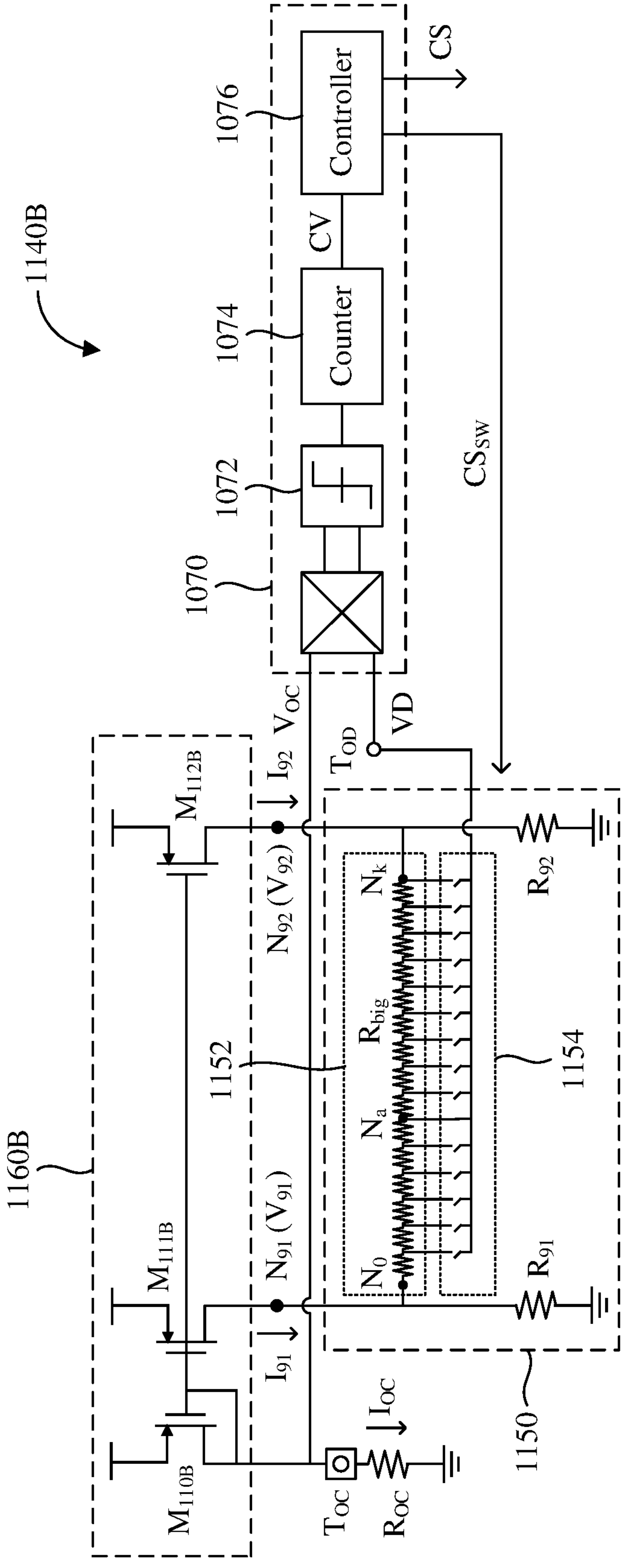
FIG. 11B illustrates another implementation of the resistance detection circuit shown in FIG. 9 in accordance with some embodiments of the present disclosure.

FIG. 11B illustrates another implementation of the resistance detection circuit 940 shown in FIG. 9 in accordance with some embodiments of the present disclosure. The circuit topology of the resistance detection circuit 1140B is identical/similar to that of the resistance detection circuit 1140A shown in FIG. 11A except for the current generator 1160B. In the present embodiment, the current generator 1160B may be implemented using the transistors $M_{110B}$-$M_{112B}$. Each of the current $I_{91}$ (flowing through the transistor $M_{111B}$) and the current $I_{92}$ (flowing through the transistor $M_{112B}$) can be equal to or substantially equal to the reference current $I_{OC}$ flowing through the transistor $M_{110B}$. As those skilled in the art can appreciate the operation of the resistance detection circuit 1140B after reading the above paragraphs directed to FIG. 10A, FIG. 10B and FIG. 11A, further description is omitted here for brevity.

Referring again to FIG. 8, as the product of the transconductance $g_m$ and the load resistance $R_t$ can be controlled, the proposed bias scheme can control the transconductance $g_m$ to be temperature independent or temperature dependent. For example, when the load resistance $R_t$ is a constant, the bias voltage generating circuit 806 can control the transconductance $g_m$ to be a constant by locking the product $g_mR_t$ to be a fixed value, thereby making the transconductance $G_m$ of the main circuit 202_1 a constant. In other words, the transconductance $g_m$/$G_m$ can be kept constant over temperature. As another example, when the load resistance $R_t$ has a positive temperature coefficient, the bias voltage generating circuit 806 can control the transconductance $g_m$ to have a negative temperature coefficient by locking $g_mR_t$ to be a fixed value, thereby making the transconductance $G_m$ of the main circuit 202_1 have a negative temperature coefficient. As still another example, when the load resistance $R_t$ has a negative temperature coefficient, the bias voltage generating circuit 806 can control the transconductance $g_m$ to have a positive temperature coefficient by locking $g_mR_t$ to be a fixed value, thereby making the transconductance $G_m$ of the main circuit 202_1 have a positive temperature coefficient.

Figure 12:
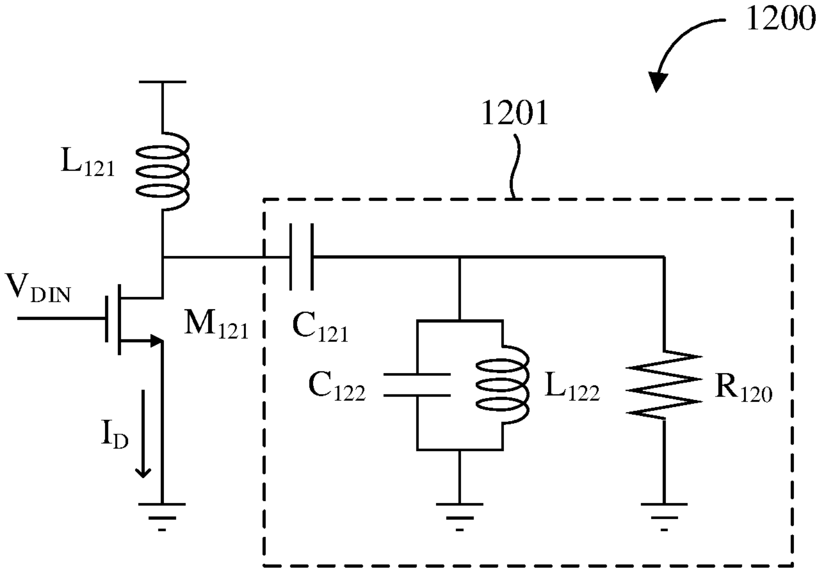
FIG. 12 is a diagram illustrating a power amplifier in accordance with some embodiments.

In some embodiments, the proposed bias scheme can be applied to large signal operation, such as operation of a power amplifier. Referring firstly to FIG. 12, a power stage of the power amplifier 1200 (e.g. a class AB amplifier) can include a transistor $M_{121}$, an inductor $L_{121}$ and a matching network 1201. The transistor $M_{121}$ is driven by a drive voltage $V_{DIN}$. The matching network 1201 includes an inductor $L_{122}$, capacitors $C_{121}$ and $C_{122}$, and a resistor $R_{120}$. In the embodiment of FIG. 12, changes in PVT can cause variations in a drain current $I_D$ of the transistor $M_{121}$, resulting in output power variations.

For example, a threshold voltage of the transistor $M_{121}$ changes with temperature, causing variations in the drain current $I_D$. When temperature rises, the threshold voltage of the transistor $M_{121}$ decreases, resulting in an increase in the drain current $I_D$; when temperature decreases, the threshold voltage of the transistor $M_{121}$ increases, resulting in a decrease in the drain current $I_D$. As another example, electron mobility changes with temperature, causing variations in the drain current $I_D$. When temperature rises, the electron mobility decreases, resulting in a decrease in the drain current $I_D$; when temperature decreases, the electron mobility increases, resulting in an increase in the drain current $I_D$. Note that the electron mobility and the threshold voltage have opposite effects on the drain current $I_D$ when temperature changes.

Figure 13:
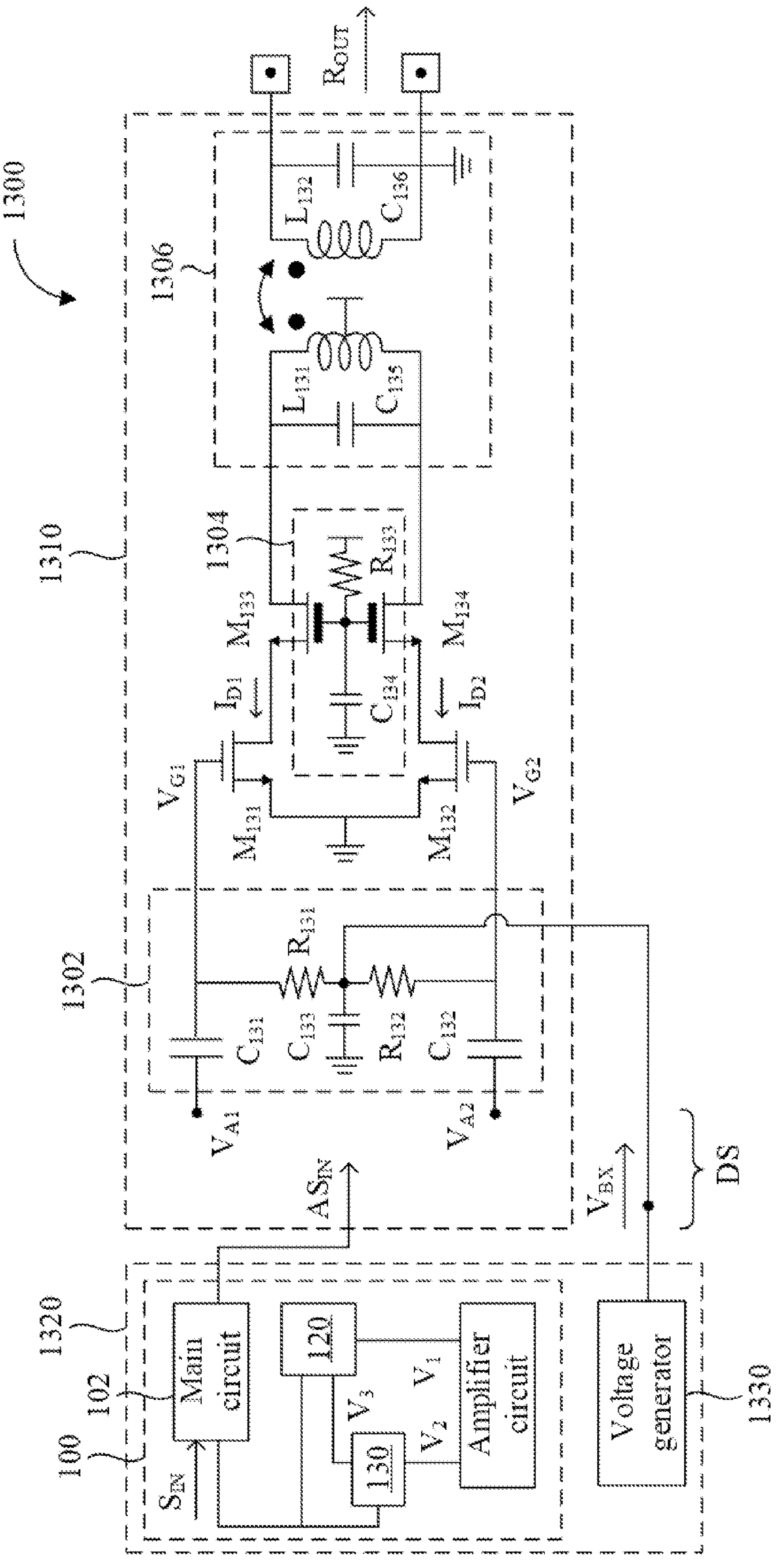
FIG. 13 is a diagram illustrating an exemplary power amplifier in accordance with some embodiments of the present disclosure.

The proposed bias scheme can be applied to a power amplifier to keep output power of the power amplifier constant/stable against PVT variations. FIG. 13 is a diagram illustrating an exemplary power amplifier in accordance with some embodiments of the present disclosure. The power amplifier 1300 can be implemented as a class AB amplifier for illustrative purposes. Those skilled in the art can appreciate that the proposed bias scheme can be applied to other types/classes of amplifiers without departing from the scope of the present disclosure.

The power amplifier 1300 includes a power stage 1310 and a driver stage 1320. The power stage 1310 can be driven by a drive signal DS to generate an output signal $R_{OUT}$. The power stage 1310 includes, but is not limited to, a plurality of transistors $M_{131}$-$M_{134}$ and a plurality of matching networks 1302, 1304 and 1306. The drive signal DS includes an input signal $AS_{IN}$ and an input voltage $V_{BX}$, and the input signal $AS_{IN}$ includes a pair of differential input voltages $V_{A1}$ and $V_{A2}$. The input voltage $V_{A1}/V_{A2}$ serves as an AC component of the drive signal DS, and the input voltage $V_{BX}$ serves as a DC component of the drive signal DS. The matching network 1302 is coupled to the input signal $AS_{IN}$ and the input voltage $V_{BX}$, and arranged to output the drive voltages $V_{G1}$ and $V_{G2}$ (e.g. a pair of differential voltages) to the transistors $M_{131}$ and $M_{132}$, respectively.

The matching network 1302 may include, but is not limited to, a plurality of capacitors $C_{131}$-$C_{133}$, and a plurality of resistors $R_{131}$ and $R_{132}$. The input voltage $V_{A1}$ is capacitively coupled to the transistor $M_{131}$ to provide an AC component of the drive voltage $V_{G1}$, and the input voltage $V_{BX}$ is coupled to the transistor $M_{131}$ through the resistor $R_{131}$ to provide a DC component of the drive voltage $V_{G1}$. The input voltage $V_{A2}$ is capacitively coupled to the transistor $M_{132}$ to provide an AC component of the drive voltage $V_{G2}$, and the input voltage $V_{BX}$ is coupled to the transistor $M_{132}$ through the resistor $R_{132}$ to provide a DC component of the drive voltage $V_{G2}$. In addition, the matching network 1304 may include a resistor $R_{133}$ and a capacitor $C_{134}$. The matching network 1306 may include a plurality of inductors $L_{131}$ and $L_{132}$, and a plurality of capacitors $C_{135}$ and $C_{136}$.

The driver stage 1320 can be configured to provide the drive signal DS, thereby keeping a transistor current (e.g. a drain current $I_{D1}/I_{D2}$) substantially constant or stable against PVT variations. Constant/stable transistor current can contribute to constant/stable output power. For example, as a change in electron mobility due to a rise in temperature can cause a decrease in drain current, the drive signal DS may include a signal component having a positive temperature coefficient to compensate for the effect of changes in electron mobility on the drain current $I_{D1}/I_{D2}$. As another example, as a change in threshold voltage due to a rise in temperature can cause an increase in drain current, the drive signal DS may include a signal component having a negative temperature coefficient to compensate for the effect of changes in threshold voltage on the drain current $I_{D1}/I_{D2}$.

In the present embodiment, the driver stage 1320 may include the signal generator circuit 100 shown in FIG. 1 and a voltage generator 1330. The signal generator circuit 100 can serve as a preamplifier that is configured to provide an AC component of the drive signal DS (i.e. the input voltage $V_{A1}/V_{A2}$). The main circuit 102 can be configured to generate the AC component of the drive signal DS (i.e. the input voltage $V_{A1}/V_{A2}$) by amplifying the input signal $S_{IN}$ (e.g. an RF input signal). In addition, the voltage generator 1330 is coupled to the power stage 1302, and configured to provide the DC component of the drive signal DS (i.e. the input voltage $V_{BX}$).

One of the signal generator circuit 100 and the voltage generator 1330 can be used to compensate for the effect of changes in electron mobility on the drain current $I_{D1}/I_{D2}$, and the other can be used to compensate for the effect of changes in threshold voltage on the drain current $I_{D1}/I_{D2}$. For example, the signal generator circuit 100 can be configured to provide the input voltage $V_{A1}/V_{A2}$ (i.e. an AC component of the drive signal DS) having a positive temperature coefficient, thereby compensating for the effect of changes in electron mobility on the drain current $I_{D1}/I_{D2}$. As another example, the voltage generator 1330 can be configured to provide the input voltage $V_{BX}$ (i.e. a DC component of the drive signal DS) having a negative temperature coefficient, thereby compensating for the effect of changes in threshold voltage on the drain current $I_{D1}/I_{D2}$.

In the embodiment shown in FIG. 13, the voltage generator 120 can be configured to provide the transconductance $g_m$ having a positive temperature coefficient, and the main circuit 102 can be configured to provide the transconductance $G_m$ having a positive temperature coefficient according to the transconductance $g_m$. For example, the voltage generator 130 can control the ratio of the voltage input $V_2$ to the voltage input $V_3$ to thereby control a product of the transconductance $g_m$ and the load resistance $R_t$. When the load resistance $R_t$ has a negative temperature coefficient, the transconductance $g_m$ can have a positive temperature coefficient if the product $g_mR_t$ is locked to a fixed value or adjusted to a suitable value.

Figure 4:
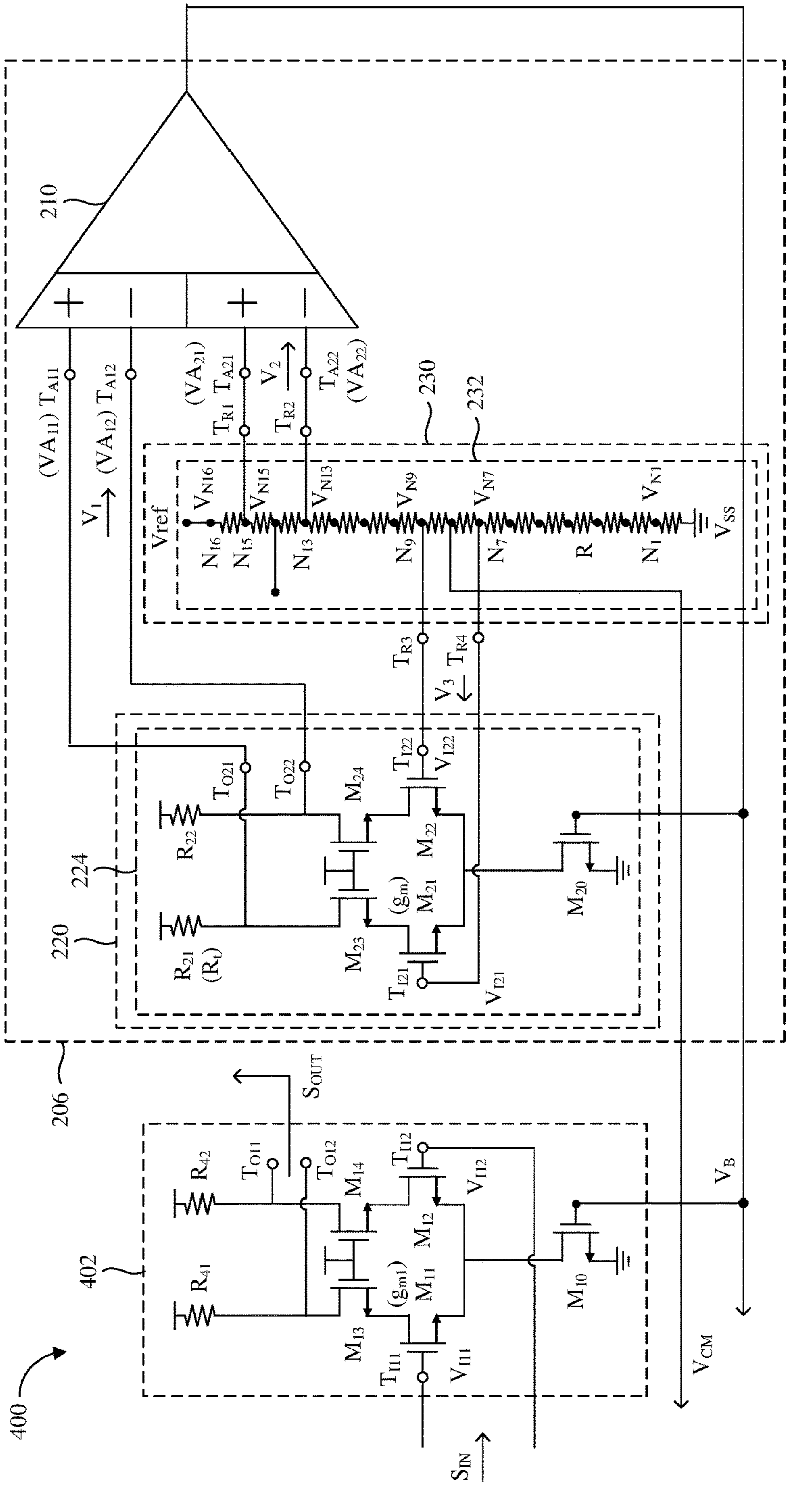
FIG. 4 illustrates another implementation of the signal generator circuit shown in FIG. 1 in accordance with some embodiments of the present disclosure.

Note that the signal generator circuit 100 can be implemented using the signal generator circuit 200 shown in FIG. 2, the signal generator circuit 400 shown in FIG. 4, the signal generator circuit 500 shown in FIG. 5, the signal generator circuit 600 shown in FIG. 6, the signal generator circuit 800 shown in FIG. 8, or other signal generator circuits utilizing the proposed bias scheme. As those skilled in the art can appreciate the operation of the signal generator circuit 100 after reading the above paragraphs directed to FIG. 1 to FIG. 11, similar description is omitted here for brevity.

Figure 14:
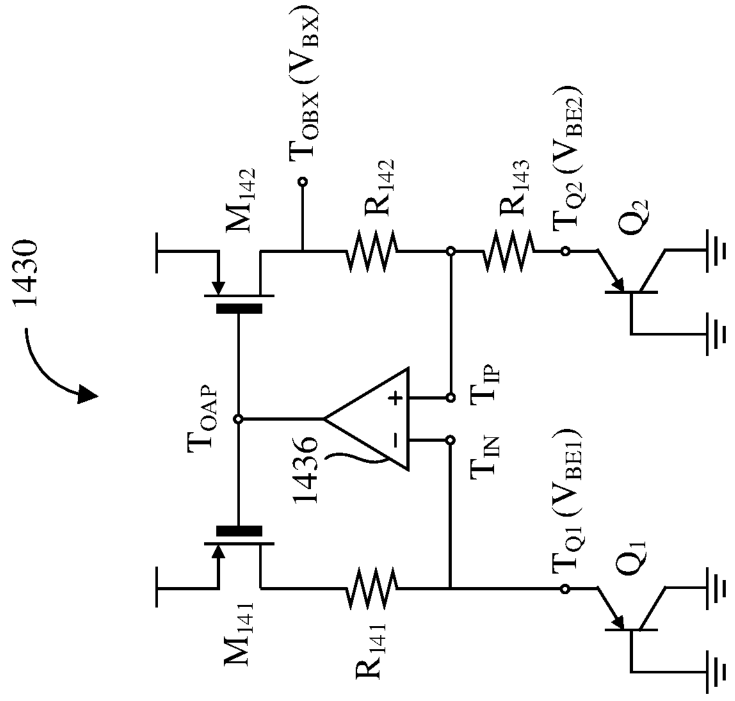
FIG. 14 illustrates an implementation of the voltage generator shown in FIG. 13 in accordance with some embodiments of the present disclosure.

FIG. 14 illustrates an implementation of the voltage generator 1330 shown in FIG. 13 in accordance with some embodiments of the present disclosure. The input voltage $V_{BX}$ outputted from an output terminal $T_{OBX}$ can have a zero, positive or negative temperature coefficient. In the present embodiment, the voltage generator 1430 may include transistors $M_{141}$ and $M_{142}$, an amplifier circuit 1436, diode-connected transistors $Q_1$ and $Q_2$, and resistive elements $R_{141}$-$R_{143}$.

A connection terminal of the transistor $M_{142}$ is coupled to the output terminal $T_{OBX}$. An output terminal $T_{OAP}$ of the amplifier circuit 1436 is coupled to respective control terminals of the transistors $M_{141}$ and $M_{142}$, and an input terminal $T_{IN}$ of the amplifier circuit 1436 is coupled to a connection terminal of the transistor $M_{141}$ through the resistive element $R_{141}$. The input terminal $T_{IN}$ of the amplifier circuit 1436 is further coupled to a connection terminal $T_{Q1}$ of the diode-connected transistor $Q_1$. In addition, the resistive element $R_{142}$ is coupled between the output terminal $T_{OBX}$ and an input terminal $T_{IP}$ of the amplifier circuit 1436. The resistive element $R_{143}$ is coupled between the input terminal $T_{IP}$ of the amplifier circuit 1436 and a connection terminal $T_{Q2}$ of the diode-connected transistor $Q_2$.

The input voltage $V_{BX}$ can be determined by the following expression:

$$V_{BX} = V_{BE2} + \left(1 + \frac{R_{142}}{R_{143}}\right)(V_{BE1} - V_{BE2}),$$

where the voltage $V_{BE1}$ represents a voltage drop across the diode-connected transistor $Q_1$ (e.g. a base-emitter voltage of a bipolar junction transistor (BJT)), and the voltage $V_{BE2}$ represents a voltage drop across the diode-connected transistor $Q_2$ (e.g. a base-emitter voltage of a BJT). Note that the voltage $V_{BE1}$ may have a positive temperature coefficient, and the voltage difference ($V_{BE1}-V_{BE2}$) may have a negative temperature coefficient. The voltage generator 1430A can generate the input voltage $V_{BX}$ having a zero, positive or negative temperature coefficient by adjusting the resistance of the resistive element $R_{142}$ and/or the resistance of the resistive element $R_{143}$. In some embodiments, when the voltage generator 1430 is configured to generate the input voltage $V_{BX}$ having a negative temperature coefficient, the input voltage $V_{BX}$ can be coupled to the transistor $M_{131}$/$M_{132}$ shown in FIG. 13 to compensate for the effect of changes in threshold voltage on the drain current $I_{D1}$/$I_{D2}$.

Figure 15:
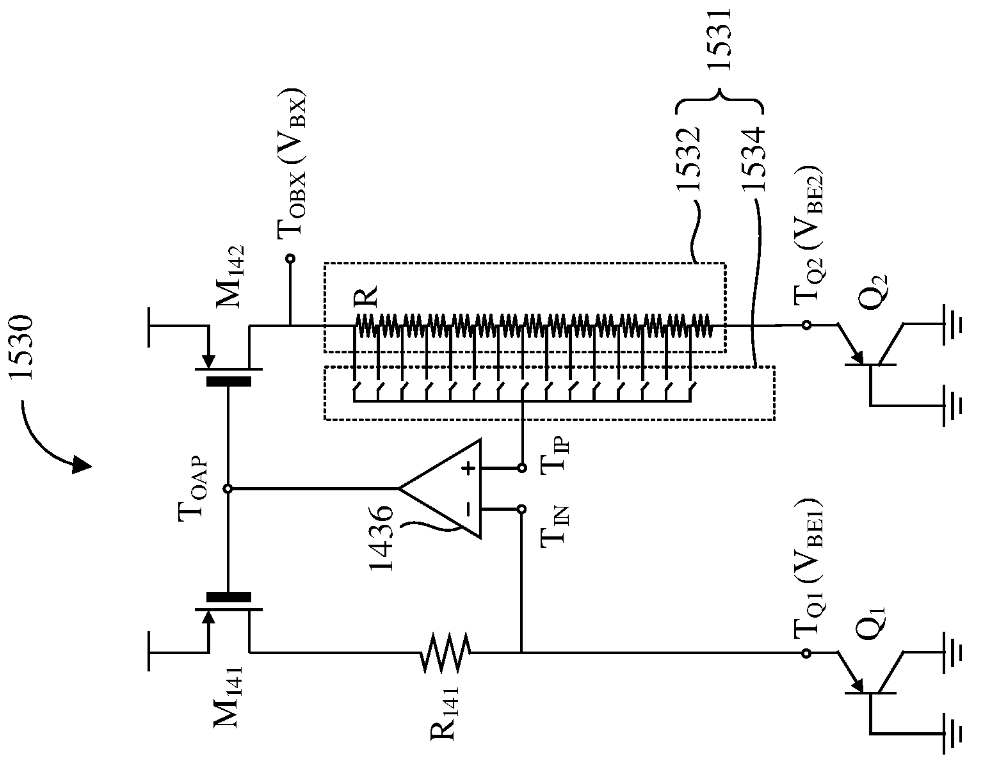
FIG. 15 illustrates another implementation of the voltage generator shown in FIG. 13 in accordance with some embodiments of the present disclosure.

FIG. 15 illustrates another implementation of the voltage generator 1330 shown in FIG. 13 in accordance with some embodiments of the present disclosure. The circuit structure of the voltage generator 1530 is identical/similar to that of the voltage generator 1430 shown in FIG. 14 except for the resistor network 1531 coupled to the input terminal $T_{IP}$. The resistive elements $R_{142}$ and $R_{143}$ shown in FIG. 14 can be implemented using the resistor ladder 1532. In the embodiment shown in FIG. 15, the resistor ladder 1532 includes a set of resistors and a set of nodes. The set of resistors includes a plurality of resistors R connected in series between the output terminal $T_{OBX}$ and the connection terminal $T_{Q2}$ of the diode-connected transistor $Q_2$.

The resistor network 1531 further includes a selection circuit 1534. The selection circuit 1534 can be configured to select one from among the set of nodes, and couple the selected node to the input terminal $T_{IP}$. A first portion of the resistor ladder 1532, connected between the output terminal $T_{OBX}$ and the selected node, can serve as the resistive element $R_{142}$ shown in FIG. 14; a second portion of the resistor ladder 1532, connected between the selected node and the connection terminal $T_{Q2}$, can serve as the resistive element $R_{143}$ shown in FIG. 14. In the example of FIG. 15, the selection circuit 1534 can include a plurality of switches, each of which is selectively coupled between input terminal $T_{IP}$ and a corresponding node. When one of the switches is switched on, the others are switched off.

The circuit topologies described above are provided for illustrative purposes only, and are not intended to limit the scope of the present disclosure. In some embodiments, the voltage generator 1330 shown in FIG. 13 can be implemented using other circuit structures capable of provide a voltage having a negative temperature coefficient without departing from the scope of the present disclosure. In some embodiments, the power stage 1310 shown in FIG. 13 can be implemented using other circuit structures without departing from the scope of the present disclosure.

With the use of the proposed bias scheme, a bias circuit can keep a small-signal gain of a main circuit (biased by the bias circuit) constant/stable against PVT variations. In addition, the proposed bias scheme can be applied to large signal operation to thereby keep output power of a power amplifier constant/stable against PVT variations. The proposed bias scheme can reduce the influence of PVT variations on a chip gain, decrease the cost of measurement and calibration for a single chip, and effectively reduce the gain variations across mass-produced chips to thereby decrease system calibration cost.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A bias voltage generating circuit, comprising:

an amplifier circuit, configured to generate a bias voltage according to a first voltage input and a second voltage input; and a negative feedback circuit, coupled to the amplifier circuit and configured to control the first voltage input, the negative feedback circuit comprising:

a first voltage generator, coupled to the amplifier circuit, the first voltage generator being biased by the bias voltage, and configured to amplify a third voltage input to generate the first voltage input; and a second voltage generator, coupled to the first voltage generator, the second voltage generator being configured to generate the third voltage input, wherein a ratio of the first voltage input to the third voltage input is locked according to a ratio of the second voltage input to the third voltage input.

2. The bias voltage generating circuit of claim 1, wherein the ratio of the first voltage input to the third voltage input is a product of a transconductance and a load resistance of the first voltage generator; the ratio of the second voltage input to the third voltage input changes in response to a change in the load resistance, and the transconductance is kept constant.

3. The bias voltage generating circuit of claim 1, wherein the ratio of the first voltage input to the third voltage input is a product of a transconductance and a load resistance of the first voltage generator; the bias voltage generating circuit further comprises:

a resistance detection circuit, coupled to the second voltage generator, the resistance detection circuit being configured to detect the load resistance to generate a control signal, wherein the second voltage generator is configured to provide the second voltage input according to the control signal.

4. The bias voltage generating circuit of claim 3, wherein the resistance detection circuit comprises:

a resistive network, having N resistive elements coupled to N connection nodes respectively, N being a positive integer, wherein a resistance of each resistive element changes in response to a change in the load resistance, and the resistive network is configured to generate a detection voltage according to N input voltages at the N connection nodes;

a current generator, coupled to the N connection nodes and coupled to an external resistive element through a reference terminal, the current generator being configured to generate N currents according to a reference current flowing through the external resistive element, wherein the N currents flow through the N resistive elements to generate the N input voltages at the N connection nodes, respectively; and a processing circuit, coupled to the resistive network and the reference terminal, the processing circuit being configured to generate the control signal according to the detection voltage and a first reference voltage at the reference terminal.

5. The bias voltage generating circuit of claim 4, wherein N=1 and the resistive element comprises:

a resistor ladder, comprising a set of resistors and a set of nodes, the set of resistors comprising a plurality of resistors connected in series between the connection node and a second reference voltage, the set of nodes being arranged to provide a set of node voltages according to the input voltage at the connection node and the second reference voltage; and a selection circuit, configured to select one from among the set of nodes and couple the selected node to the processing circuit, wherein a node voltage at the selected node serves as the detection voltage;

wherein the processing circuit is configured to generate the control signal by comparing the detection voltage with the first reference voltage.

6. The bias voltage generating circuit of claim 4, wherein the N resistive elements comprises a first resistive element and a second resistive element; a resistance of the first resistive element is different from a resistance of the second resistive element; the N connection nodes comprises a first connection node and a second connection node; the first connection node is coupled to the first resistive element, and the second connection node is coupled to the second resistive element; the resistive network further comprises:

a resistor ladder, comprising a set of resistors and a set of nodes, the set of resistors comprising a plurality of resistors connected in series between the first connection node and the second connection node, the set of nodes being arranged to provide a set of node voltages according to the input voltage at the first connection node and the input voltage at the second connection node; and a selection circuit, configured to select one from among the set of nodes and couple the selected node to the processing circuit, wherein a node voltage at the selected node serves as the detection voltage;

wherein the processing circuit is configured to generate the control signal by comparing the first reference voltage and the detection voltage.

7. The bias voltage generating circuit of claim 1, wherein the second voltage generator comprises:

a resistor ladder, comprising a set of resistors and a set of nodes, the set of resistors comprising a plurality of resistors connected in series between a first reference voltage and a second reference voltage, the set of nodes being arranged to provide a set of node voltages according to the first reference voltage and the second reference voltage;

a first output terminal, coupled to a first node in the set of nodes;

a second output terminal, coupled to a second node in the set of nodes, wherein a voltage difference between the first node and the second node serves as the second voltage input;

a third output terminal, coupled to a third node in the set of nodes; and a fourth output terminal, coupled to a fourth node in the set of nodes, wherein a voltage difference between the third node and the fourth node serves as the third voltage input.

8. The bias voltage generating circuit of claim 7, wherein the second voltage generator further comprises:

a selection circuit, configured to select the first node from among the set of nodes and couple the first node to the first output terminal.

9. A signal generator circuit, comprising:

a main circuit, biased by a bias voltage and configured to provide an output signal according to an input signal; and a bias voltage generating circuit, coupled to the main circuit, the bias voltage generating circuit comprising:

an amplifier circuit, configured to generate the bias voltage according to a first voltage input and a second voltage input;

a first voltage generator, coupled to the amplifier circuit, the first voltage generator being biased by the bias voltage and configured to amplify a third voltage input to generate the first voltage input, wherein direct current (DC) biasing of the main circuit is the same as DC biasing of the first voltage generator; and a second voltage generator, coupled to the first voltage generator, the second voltage generator being configured to generate the third voltage input, wherein a ratio of the first voltage input to the third voltage input is locked according to a ratio of the second voltage input to the third voltage input.

10. The signal generator circuit of claim 9, wherein the main circuit is configured to receive the input signal and a reference signal to generate a fourth voltage input, and amplify the fourth voltage input to generate the output signal; the second voltage generator is further configured to provide a common-mode component of the third voltage input to the main circuit, and the common-mode component of the third voltage input serves as the reference signal.

11. The signal generator circuit of claim 9, wherein the first voltage generator and the second voltage generator are arranged to provide a negative feedback path to control the first voltage input to be equal to the second voltage input.

12. The signal generator circuit of claim 9, wherein the ratio of the first voltage input to the third voltage input is a product of a transconductance and a load resistance of the first voltage generator; the ratio of the second voltage input to the third voltage input changes in response to a change in the load resistance, and the transconductance is kept constant.

13. The signal generator circuit of claim 9, wherein the ratio of the first voltage input to the third voltage input is a product of a transconductance and a load resistance of the first voltage generator; the bias voltage generating circuit further comprises:

a resistance detection circuit, coupled to the second voltage generator, the resistance detection circuit being configured to detect the load resistance to generate a control signal, wherein the second voltage generator is configured to provide the second voltage input according to the control signal.

14. The signal generator circuit of claim 9, wherein the second voltage generator comprises:

a resistor ladder, comprising a set of resistors and a set of nodes, the set of resistors comprising a plurality of resistors connected in series between a first reference voltage and a second reference voltage, the set of nodes being arranged to provide a set of node voltages according to the first reference voltage and the second reference voltage;

a first output terminal, coupled to a first node in the set of nodes;

a second output terminal, coupled to a second node in the set of nodes, wherein a voltage difference between the first node and the second node serves as the second voltage input;

a third output terminal, coupled to a third node in the set of nodes; and a fourth output terminal, coupled to a fourth node in the set of nodes, wherein a voltage difference between the third node and the fourth node serves as the third voltage input.

15. A power amplifier, comprising:

a power stage, driven by a drive signal to generate an output signal;

a preamplifier, coupled to the power stage, the preamplifier being configured to provide an alternating current (AC) component of the drive signal, the preamplifier comprising:

a main circuit, biased by a bias voltage and configured to amplify an input signal to generate the AC component of the drive signal;

a first amplifier circuit, configured to generate the bias voltage according to a first voltage input and a second voltage input;

a first voltage generator, coupled to the first amplifier circuit, the first voltage generator being biased by the bias voltage and configured to amplify a third voltage input to generate the first voltage input; and a second voltage generator, coupled to the first voltage generator, the second voltage generator being configured to generate the third voltage input, wherein a ratio of the first voltage input to the third voltage input is locked according to a ratio of the second voltage input to the third voltage input; and a third voltage generator, coupled to the power stage, the third voltage generator being configured to provide a direct current (DC) component of the drive signal.

16. The power amplifier of claim 15, wherein the AC component of the drive signal has a positive temperature coefficient, and the DC component of the drive signal has a negative temperature coefficient.

17. The power amplifier of claim 15, wherein the first voltage generator is configured to provide a first transconductance having a positive temperature coefficient, and the main circuit is configured to provide a second transconductance having a positive temperature coefficient according to the first transconductance.

18. The power amplifier of claim 17, wherein the ratio of the first voltage input to the third voltage input is a product of the first transconductance and a load resistance of the first voltage generator, and the load resistance of the first voltage generator has a negative temperature coefficient.

19. The power amplifier of claim 15, wherein an output terminal of the third voltage generator is arranged to provide the DC component of the drive signal; the third voltage generator comprises:

a first transistor and a second transistor, wherein a connection terminal of the second transistor is coupled to the output terminal of the third voltage generator;

a second amplifier circuit, wherein an output terminal of the second amplifier circuit is coupled to respective control terminals of the first transistor and the second transistor, and a first input terminal of the second amplifier circuit is coupled to a connection terminal of the first transistor;

a first diode-connected transistor and a second diode-connected transistor, wherein a connection terminal of the first diode-connected transistor is coupled to the first input terminal of the second amplifier circuit; and a first resistive element and a second resistive element, wherein the first resistive element is coupled between the output terminal of the third voltage generator and a second input terminal of the second amplifier circuit, and the second resistive element is coupled between the second input terminal of the second amplifier circuit and a connection terminal of the second diode-connected transistor.

20. The power amplifier of claim 19, wherein the first resistive element is a first portion of a resistor ladder, and the second resistive element is a second portion of the resistor ladder; the resistor ladder comprises a set of resistors and a set of nodes; the set of resistors comprises a plurality of resistors connected in series between the output terminal of the third voltage generator and the connection terminal of the second diode-connected transistor; the third voltage generator further comprises:

a selection circuit, configured to select one from among the set of nodes and couple the selected node to the second input terminal of the second amplifier circuit, wherein the first portion of the resistor ladder is connected between the output terminal of the third voltage generator and the selected node, and the second portion of the resistor ladder is connected between the selected node and the connection terminal of the second diode-connected transistor.

* * * * *